US009147681B2

(12) United States Patent
Liu

(10) Patent No.: US 9,147,681 B2
(45) Date of Patent: *Sep. 29, 2015

(54) ELECTRONIC SYSTEMS HAVING SUBSTANTIALLY VERTICAL SEMICONDUCTOR STRUCTURES

(71) Applicant: Micron Technology, Inc., Boise, ID (US)

(72) Inventor: Zengtao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

This patent is subject to a terminal disclaimer.

(21) Appl. No.: 14/028,987

(22) Filed: Sep. 17, 2013

(65) Prior Publication Data

US 2014/0021530 A1    Jan. 23, 2014

Related U.S. Application Data

(63) Continuation of application No. 13/547,399, filed on Jul. 12, 2012, now Pat. No. 8,564,045, which is a continuation of application No. 12/836,853, filed on Jul. 15, 2010, now Pat. No. 8,237,213.

(51) Int. Cl.
*H01L 29/792* (2006.01)
*H01L 27/088* (2006.01)
*H01L 27/115* (2006.01)

(52) U.S. Cl.
CPC .......... *H01L 27/088* (2013.01); *H01L 27/1157* (2013.01); *H01L 27/11565* (2013.01); *H01L 27/11582* (2013.01); *H01L 29/7926* (2013.01)

(58) Field of Classification Search
CPC ............ H01L 29/792; H01L 27/11568; H01L 27/115; H01L 21/28282; H01L 27/11578; H01L 27/11582; H01L 29/7926
See application file for complete search history.

(56) References Cited

U.S. PATENT DOCUMENTS

| | | | |
|---|---|---|---|
| 6,727,544 B2 | 4/2004 | Endoh et al. | |
| 7,851,851 B2 | 12/2010 | Mokhlesi et al. | |
| 8,013,389 B2 | 9/2011 | Oh et al. | |
| 8,089,120 B2 | 1/2012 | Tanaka et al. | |
| 8,203,211 B2* | 6/2012 | Jeong et al. | 257/773 |
| 8,237,213 B2* | 8/2012 | Liu | 257/319 |

(Continued)

FOREIGN PATENT DOCUMENTS

| | | |
|---|---|---|
| JP | 2007317874 A | 12/2007 |
| JP | 2008-159804 | 7/2008 |

(Continued)

OTHER PUBLICATIONS

Jang et al., "Vertical Cell Array using TCAT (Terabit Cell Array Transistor) Technology for Ultra High Density NAND Flash Memory", 2009 Symposium on VLSI Technology Digest of Technical Papers, pp. 192-193.

*Primary Examiner* — Zandra Smith
*Assistant Examiner* — Jaehwan Oh
(74) *Attorney, Agent, or Firm* — Dicke, Billig & Czaja, PLLC

(57) ABSTRACT

An electronic system has first and second substantially vertical semiconductor structures. A first string of series-coupled first memory cells is adjacent to the first semiconductor structure, and a second string of series-coupled second memory cells is adjacent to the second semiconductor structure.

21 Claims, 20 Drawing Sheets

(56) References Cited

U.S. PATENT DOCUMENTS

| | | | |
|---|---|---|---|
| 8,299,521 B2 * | 10/2012 | Lee et al. | 257/326 |
| 8,319,275 B2 * | 11/2012 | Shim et al. | 257/324 |
| 8,325,527 B2 | 12/2012 | Jin et al. | |
| 8,329,513 B2 | 12/2012 | Pekny | |
| 8,441,059 B2 * | 5/2013 | Sim et al. | 257/324 |
| 8,564,045 B2 * | 10/2013 | Liu | 257/319 |
| 8,748,969 B2 * | 6/2014 | Wenxu et al. | 257/324 |
| 2007/0158736 A1 | 7/2007 | Arai et al. | |
| 2008/0179659 A1 | 7/2008 | Enda et al. | |
| 2008/0259687 A1 | 10/2008 | Specht et al. | |
| 2009/0173981 A1 | 7/2009 | Nitta | |
| 2009/0180324 A1 | 7/2009 | Ramaswamy et al. | |
| 2009/0184360 A1 * | 7/2009 | Jin et al. | 257/319 |
| 2009/0230454 A1 | 9/2009 | Pekny | |
| 2009/0294833 A1 * | 12/2009 | Kim | 257/324 |
| 2010/0140685 A1 * | 6/2010 | Kang et al. | 257/324 |
| 2010/0163968 A1 * | 7/2010 | Kim et al. | 257/324 |
| 2010/0224929 A1 * | 9/2010 | Jeong et al. | 257/324 |
| 2010/0226195 A1 * | 9/2010 | Lue | 365/230.06 |
| 2011/0002178 A1 * | 1/2011 | Hwang et al. | 365/189.011 |
| 2011/0018051 A1 * | 1/2011 | Kim et al. | 257/324 |
| 2011/0149656 A1 | 6/2011 | Tang et al. | |
| 2011/0198687 A1 | 8/2011 | Lee | |
| 2012/0091521 A1 | 4/2012 | Goda | |

FOREIGN PATENT DOCUMENTS

| | | |
|---|---|---|
| JP | 2009-117843 | 5/2009 |
| JP | 2009-164485 | 7/2009 |
| JP | 2010-118530 | 5/2010 |
| JP | 2008159699 A | 7/2010 |
| JP | 2010-192569 | 9/2010 |
| JP | 2002299478 A | 10/2011 |
| JP | 2008186868 A | 8/2014 |

* cited by examiner

ELECTRONIC SYSTEMS HAVING SUBSTANTIALLY VERTICAL SEMICONDUCTOR STRUCTURES

RELATED APPLICATIONS

This application is a continuation of U.S. application Ser. No. 13/547,399, titled "MEMORY ARRAYS HAVING SUBSTANTIALLY VERTICAL, ADJACENT SEMICONDUCTOR STRUCTURES AND THE FORMATION THEREOF," filed Jul. 12, 2012 and issued as U.S. Pat. No. 8,564,045 on Oct. 22, 2013, which is a continuation of U.S. application Ser. No. 12/836,853 of the same title," filed Jul. 15, 2010 and issued as U.S. Pat. No. 8,237,213 on Aug. 7, 2012, both of which are commonly assigned and incorporated in their entirety herein by reference.

FIELD

The present disclosure relates generally to electronic systems, and, in particular, in some embodiments, the present disclosure relates to electronic systems having substantially vertical semiconductor structures.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

In order for memory manufacturers to remain competitive, memory designers are constantly trying to increase the density of memory devices. Increasing the density of a flash memory device generally requires reducing spacing between memory cells and/or making memory cells smaller. Smaller dimensions of some device elements may cause operational problems with the cell. For example, the channel between the source/drain regions becomes shorter, possibly causing severe short channel effects.

One way of increasing the density of memory devices is to form stacked memory arrays, e.g., often referred to as three-dimensional memory arrays. For example, one type of three-dimensional memory array includes a plurality of traditional "two-dimensional" arrays, such as NAND memory arrays, stacked vertically one atop the other, with the memory cells of each memory array being silicon-on-sapphire transistors, silicon-on-insulator transistors, thin film transistors, thermoelectric polymer transistors, semiconductor-oxide-nitride-oxide-semiconductor transistors, etc. Another type of three-dimensional memory array includes pillars of stacked memory cells, e.g., forming vertical NAND strings.

For the reasons stated above, and for other reasons stated below which will become apparent to those skilled in the art upon reading and understanding the present specification, there is a need in the art for alternative stacked (e.g., three-dimensional) memory arrays.

DETAILED DESCRIPTION

Figure 1:
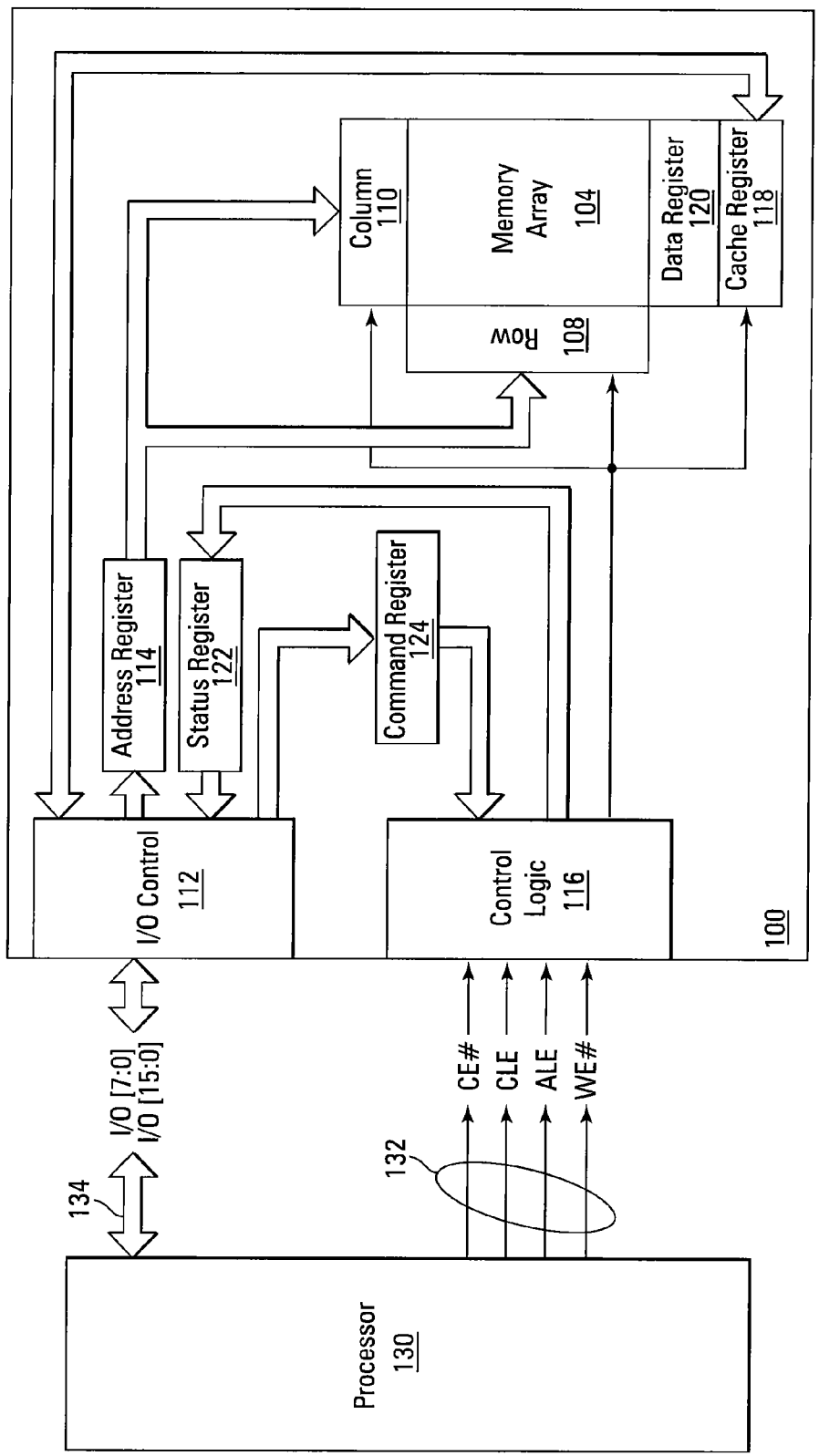
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof. The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The following detailed description is, therefore, not to be taken in a limiting sense, and the scope of the present disclosure is defined only by the appended claims and equivalents thereof. The following detailed description is, therefore, not to be taken in a limiting sense.

FIG. 1 is a simplified block diagram of a NAND flash memory device 100 in communication with a processor 130 as part of an electronic system, according to an embodiment. The processor 130 may be a memory controller or other external host device.

Memory device 100 includes an array of memory cells 104, according to embodiments of the disclosure. For example, memory array 104 may include pillars, with each pillar having a pair of strings (e.g. NAND strings) of serially coupled memory cells thereon.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

FIGS. 2A-2D are cross-sectional views of a portion of a memory array 200, during various stages of fabrication. FIGS. 3A-3D are cross-sectional views respectively corresponding to FIGS. 2A-2D. Memory array 200 may form a portion of memory array 104 of FIG. 1.

Figure 2A:
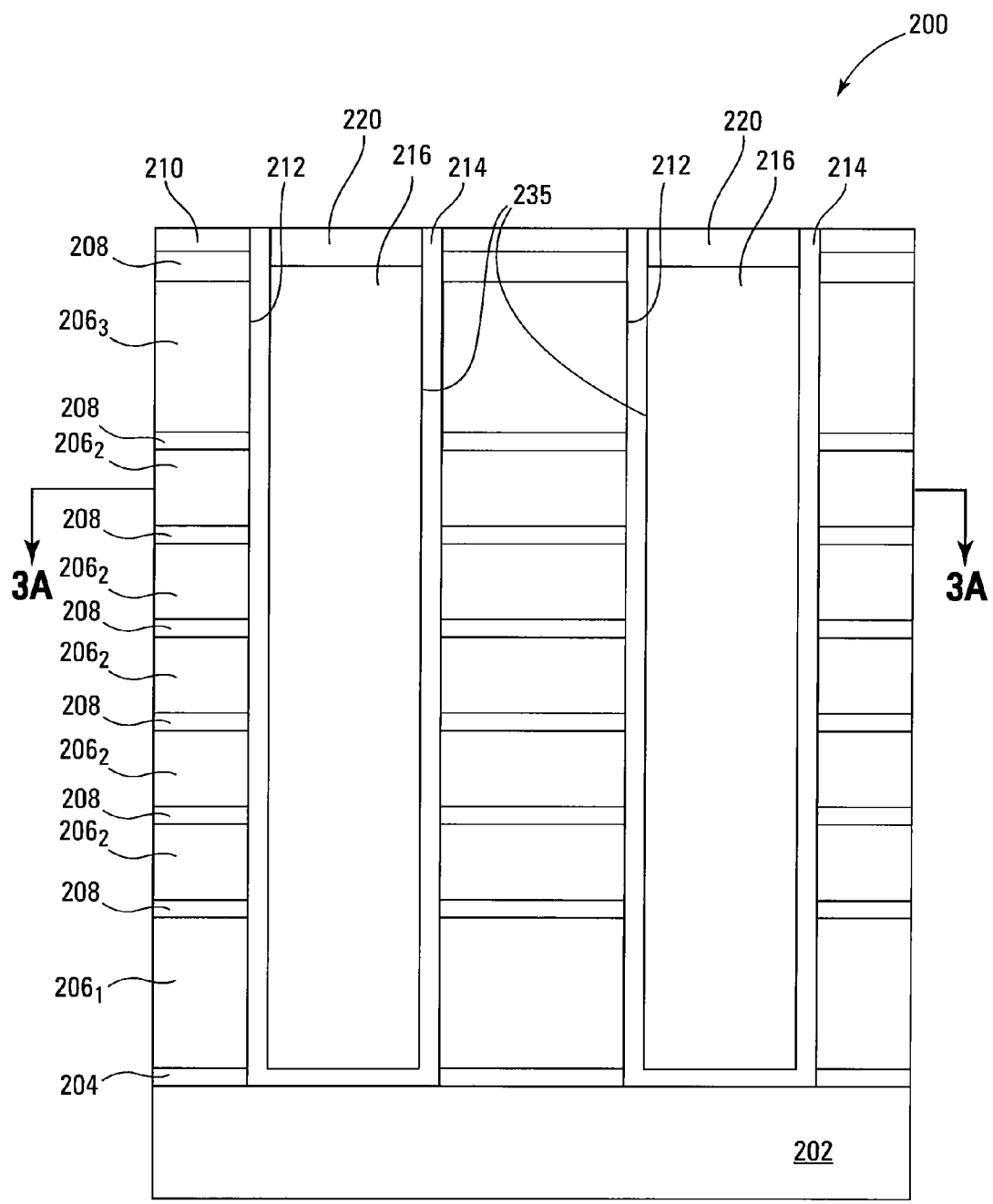
FIGS. 2A-2D are cross-sectional views of a memory array during various stages of fabrication, according to another embodiment.
Figure 3A:
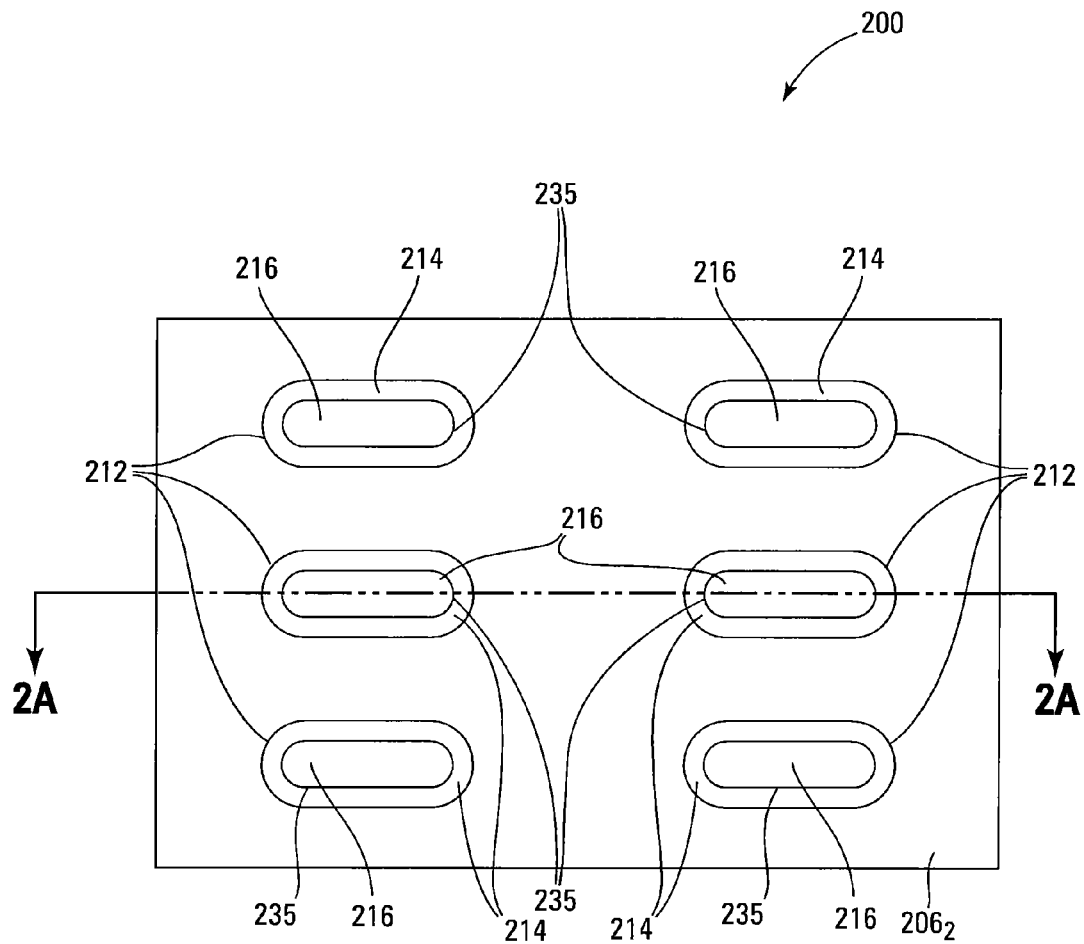
FIGS. 3A-3D are cross-sectional views respectively corresponding to FIGS. 2A-2D.

FIG. 2A is a cross-section (cross-hatching omitted) of memory array 200 taken along line 2A-2A of FIG. 3A that is a cross-section (cross-hatching omitted) taken along line 3A-3A of FIG. 2A. In general, the formation of the structure of FIG. 2A may include forming a dielectric 204 over a semiconductor 202 that, in some embodiments, may be comprised of silicon that may be conductively doped to have a p-type or n-type conductivity. Dielectric 204 may be, for example, formed from an oxide, e.g., silicon oxide, an oxynitride, e.g., silicon oxynitride, etc.

A sacrificial material, e.g., dielectric $206_1$, is then formed over dielectric 204; a dielectric 208 is formed over dielectric $206_1$; and a sacrificial material, e.g., dielectric $206_2$, is formed over dielectric 208. Dielectrics 208 and $206_2$ are then alternately formed until a sacrificial material, e.g., dielectric $206_3$, is formed over a dielectric 208, as shown in FIG. 2A. A hard mask (e.g., a dielectric cap) 210 is then formed over dielectric $206_3$. For some embodiments, dielectrics 208 may be same material as the material of dielectric 204, e.g., dielectrics 208 may be formed from an oxide, e.g., silicon oxide, an oxynitride, e.g., silicon oxynitride, etc. As one example, where dielectrics 204 and 208 are an oxide or oxynitride, the dielectrics 206 and hard mask 210 may be nitride to facilitate selective removal in subsequent processing. Because of the sacrificial nature of dielectrics 206 and 208, and hard mask 210, they need not be dielectrics as described in the examples herein.

Openings 212 (e.g., holes or slots) are then formed by patterning hard mask 210 and forming openings 212 through hard mask 210 and through dielectrics 206, 208, and 204, stopping on or within semiconductor 202. For example, a mask (not shown), e.g., of photoresist, may be formed over hard mask 210 and patterned for exposing portions of hard mask 210 and the dielectrics 206, 208, and 204. The exposed portions of hard mask 210 and the dielectrics 206, 208, and 204 are then removed, such as by etching, e.g., using an etch that is selective to dielectrics 206, 208, and 204.

A semiconductor 214, such as polysilicon, is then formed in openings 212 so as to line or fill openings 212, as shown in FIGS. 2A and 3A, e.g., after the mask is removed. For example, semiconductor 214 may be formed by a conformal deposition process, such as chemical vapor deposition (CVD), atomic layer deposition (ALD), etc. Semiconductor 214 may extend over the upper surface of hard mask 210 for some embodiments.

In embodiments where openings 212 are only lined with the semiconductor 214, a dielectric 216, such as an oxide, e.g., silicon oxide, an oxynitride, e.g., silicon oxynitride, etc., is then formed adjacent to semiconductor 214 so as to fill the remainder of each opening 212. For example, dielectric 216 may be added to openings 212 until dielectric 216 fills each opening 212 to a level above the upper surface of semiconductor 214 so that dielectric 216 extends over the upper surface of semiconductor 214 that may extend over the upper surface of hard mask 210. In embodiments where openings 212 are filled with semiconductor 214, dielectric 216 is omitted, i.e., the dielectric 216 in FIGS. 2A and 3A is replaced by semiconductor 214.

Dielectric 216 may then be removed from the upper surface of semiconductor 214, e.g., by chemical mechanical planarization (CMP) so that the upper surface of the dielectric 216 in each of openings 212 is substantially flush (e.g., flush) with the upper surface of semiconductor 214. Upper surfaces of the dielectrics 216 may then be recessed below the upper surface of semiconductor 214 that is over the upper surface of hard mask 210 (not shown) and the upper surface of hard mask 210, as shown in FIG. 2A, e.g., using a dry or wet etch-back process that is selective to dielectric 216.

A semiconductor 220, e.g., polysilicon, may then be formed over the recessed upper surfaces of dielectrics 216 and the upper surface of semiconductor 214 that is over the upper surface of hard mask 210. Subsequently, semiconductor 220 and semiconductor 214 are removed, e.g., by chemical mechanical planarization (CMP), stopping on hard mask 210, so that an upper surface of semiconductor 220 and the upper ends of the substantially vertical (e.g., vertical) sides (e.g., sidewalls) of semiconductor 214 are substantially flush (e.g., flush) with the upper surface of hard mask 210, as shown in FIG. 2A.

Dielectric 216 forms a substantially vertical (e.g., vertical) dielectric pillar 235. A semiconductor that includes semiconductors 214 and 220 surrounds each pillar 235. That is, each pillar 235 is surrounded by semiconductor 214 on its bottom and its substantially vertical (e.g., vertical) sides (e.g., sidewalls) and semiconductor 220 on its top (FIGS. 2A and 3A). For example, semiconductors 214 may be in direct contact with the sidewalls of a respective pillar 235, and semiconductor 220 may be in direct contact with the top of the respective pillar 235 and the upper portion of the sidewalls of semiconductor 214.

Figure 2B:
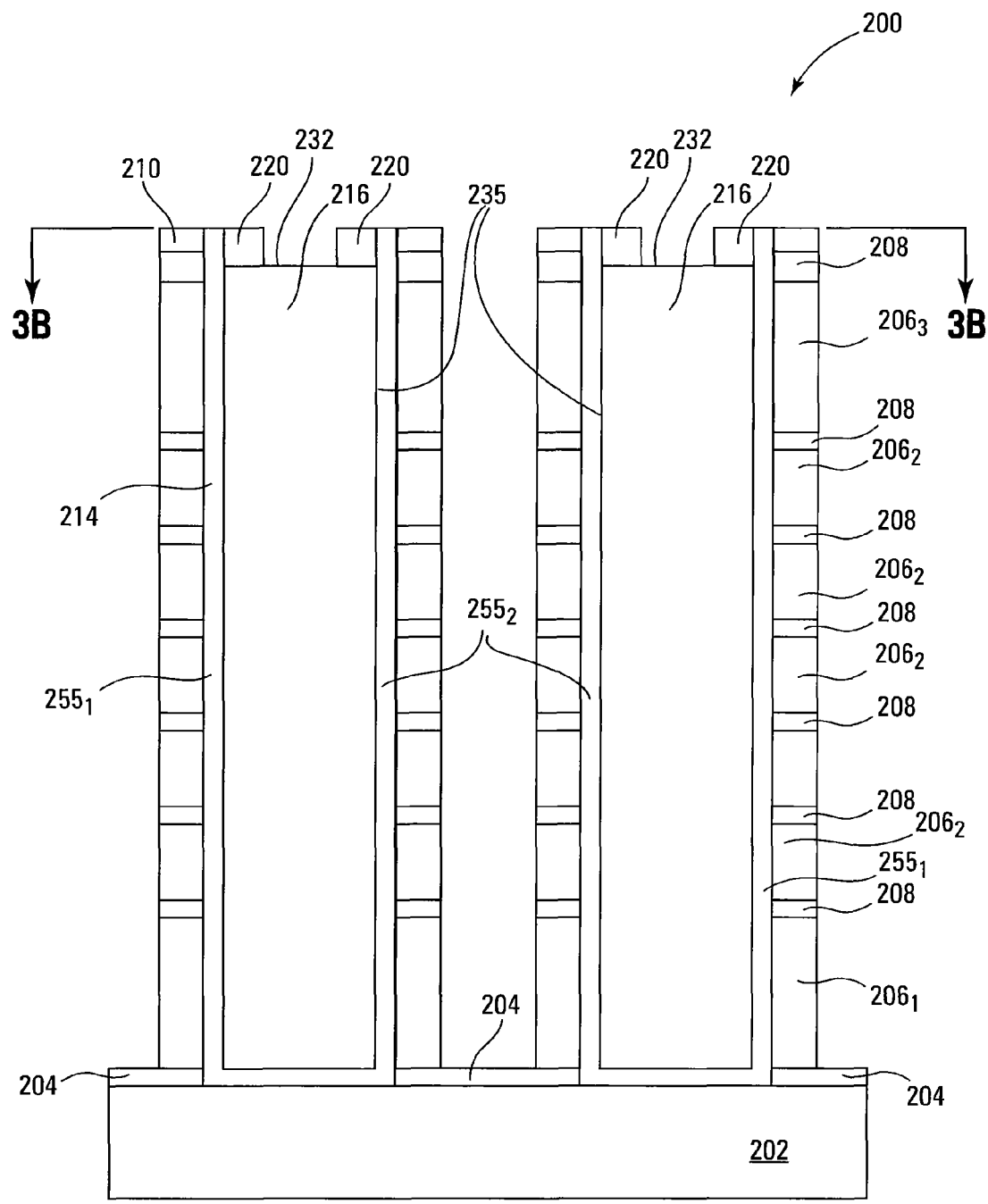
Figure 3B:
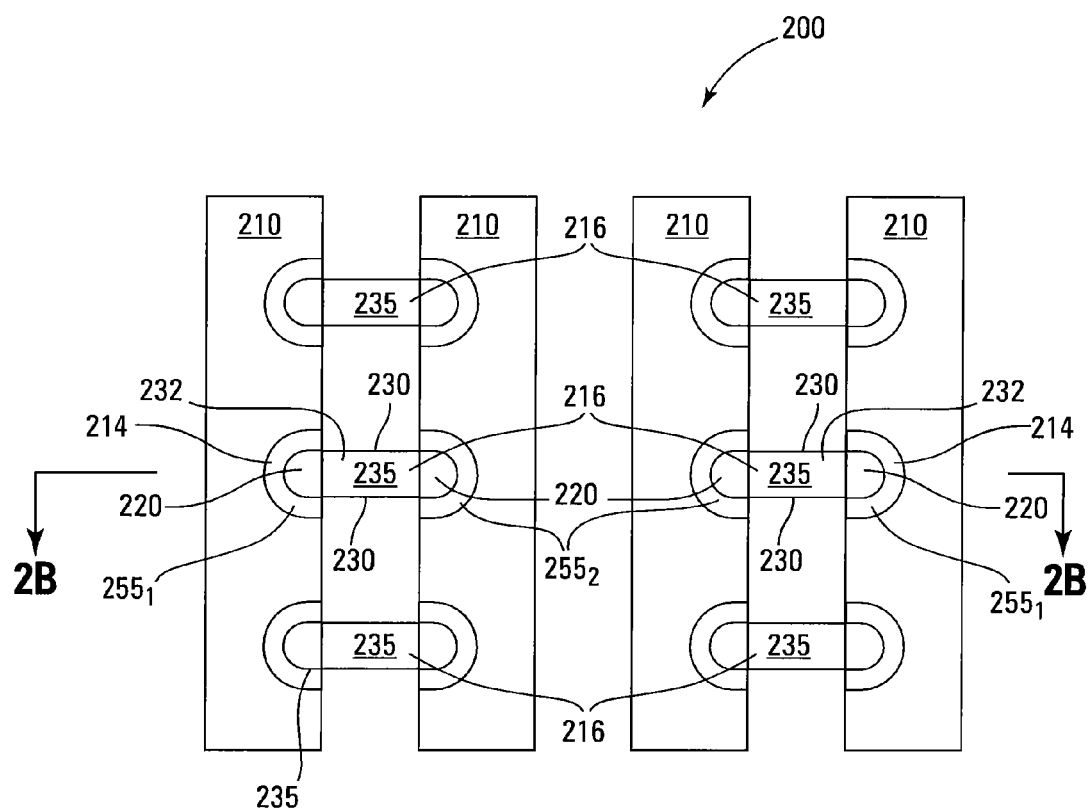

The structure of FIGS. 2A and 3A may then be patterned to form the structure of FIGS. 2B and 3B, where FIG. 2B is a cross-section (cross-hatching omitted) of memory array 200 taken along line 2B-2B of FIG. 3B that is a cross-section (cross-hatching omitted) taken along line 3B-3B of FIG. 2B. For example, a mask (not shown), e.g., of photoresist, may be formed over the structure of FIGS. 2A and 3A and patterned for exposing portions of hard mask 210 and the dielectrics 206 and 208 under those exposed portions of hard mask 210 and a portion of semiconductor 220 and portions of semiconductor 214, e.g., portions of the substantially vertical (e.g., vertical) sidewalls of semiconductor 214.

The exposed portions of hard mask 210 and the dielectrics 206 and 208 are then removed, such as by etching, stopping on dielectric 204. For example, dielectric 204 may be a different material than dielectrics 206 and 208 and hard mask 210, and the etch may be selective to dielectrics 206 and 208 and hard mask 210. Alternatively, dielectrics 206, 208, and 204 and hard mask 210 may be of the same material in which case an etch selective thereto would remove exposed portions of dielectric 204, stopping on or within semiconductor 202.

Subsequently, the exposed portion of semiconductor 220 (FIG. 2B) and portions of semiconductor 214, e.g., portions of the substantially vertical (e.g., vertical) sidewalls of semiconductor 214 (FIGS. 2B and 3B), are removed using an etch selective to semiconductors 214 and 220 (e.g., selective to polysilicon), stopping on or within dielectrics 204 and 216. For example, the removal of the portion of semiconductor 220 stops on or within dielectric 216, and the removal of the portions of the substantially vertical sidewalls of semiconductor 214 stops on or within dielectric 204. The etch that removes the portion of semiconductor 220 and the portions of semiconductor 214 may have a different chemistry than and may be performed in situ with the etch that removes portions of hard mask 210 and the dielectrics 206 and 208.

The removal of the portions of the substantially vertical (e.g., vertical) sidewalls of semiconductor 214 exposes portions 230 of the substantially vertical (e.g., vertical) sidewalls of each pillar 235, as shown in FIG. 3B, and the removal of the exposed portion of semiconductor 220 exposes a portion of an upper surface 232 of each pillar 235, as shown in FIGS. 2B and 3B. Note that portions of sacrificial dielectrics 206, portions of dielectrics 204 and 208, and portions of hard mask 210 remain adjacent to (e.g., on) the sidewalls of semiconductor 214, i.e., adjacent to the substantially vertical (e.g., vertical) sidewalls of semiconductor 214.

Removal of semiconductor 214 from the portions 230 of the substantially vertical (e.g., vertical) sidewall of each pillar 235 forms two separated opposing, substantially vertical (e.g., vertical), adjacent semiconductor structures $255_1$ and $255_2$ adjacent to (e.g., on) the remainder of the substantially vertical (e.g., vertical) sidewalls of each pillar 235 from semiconductor 214, as shown in FIGS. 2B and 3B. For example, separated semiconductor structures $255_1$ and $255_2$ may respectively wrap around opposing portions of the sidewall of each pillar 235, as shown in FIG. 3B.

Semiconductor structures $255_1$ and $255_2$ may remain connected together by the bottom of semiconductor 214, located under a respective pillar 235, as shown in FIG. 2B. The ends of each semiconductor structure 255 may be intersected by a single plane, as shown in FIG. 3B, e.g., the ends may be about 180 degrees apart. Note that portions of semiconductor 220 that are separated by the removal of the portion thereof are respectively electrically coupled to (e.g. by direct physical contact with) semiconductor structures $255_1$ and $255_2$, as shown in FIGS. 2B and 3B.

Figure 3C:
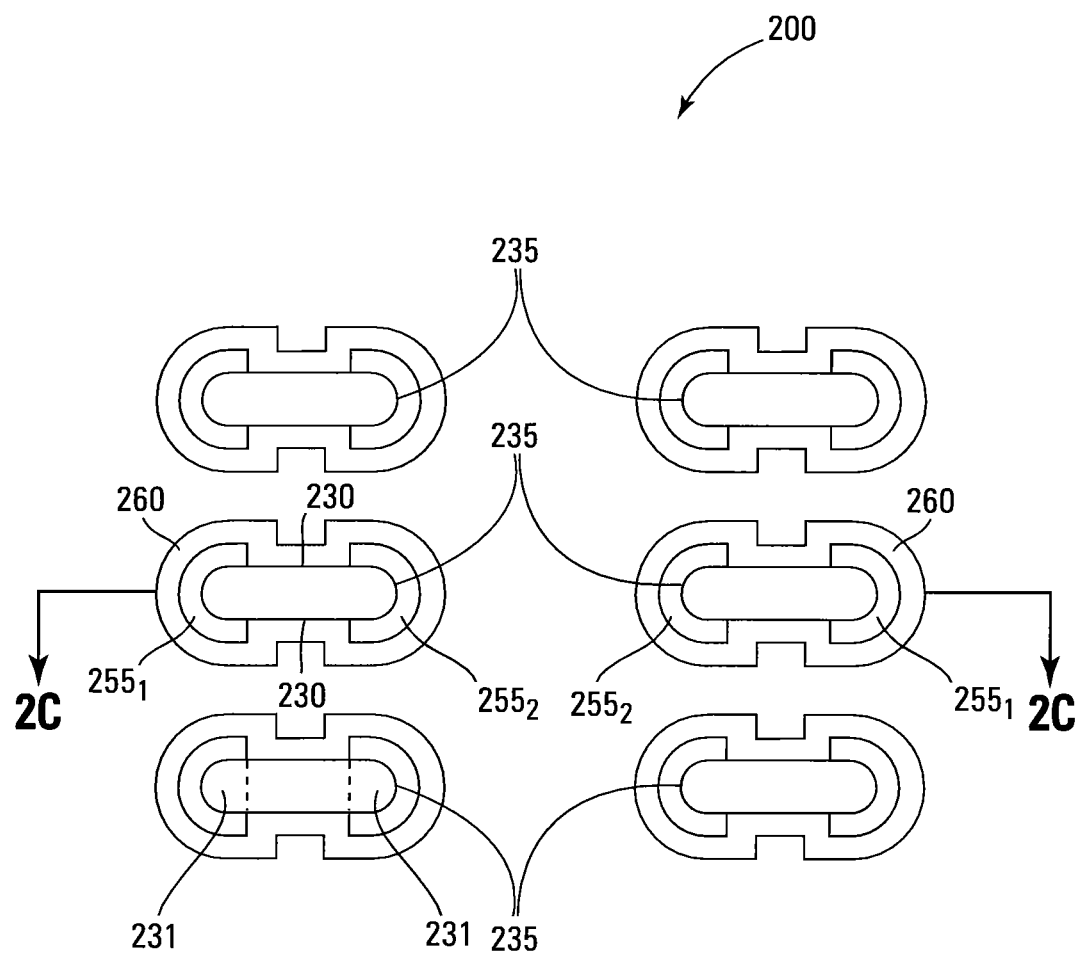

In embodiments where openings 212 are filled with semiconductor 214 and the dielectric 216 is replaced by semiconductor 214, the portion of dielectric 216, now, semiconductor 214, spanning the space between hard masks 210 is removed. In these embodiments, semiconductor structures $255_1$ and $255_2$ are semiconductor pillars. For example, the portions 231 in FIG. 3C are semiconductor 214 and form portions of semiconductor structures $255_1$ and $255_2$. In addition the portion located between the portions 231 is an opening (e.g., that may later be filled with a dielectric) that enables, for example, a charge trap 260, e.g., a continuous charge trap 260, to be formed adjacent to and around the semiconductor structures $255_1$ and $255_2$.

Figure 2C:
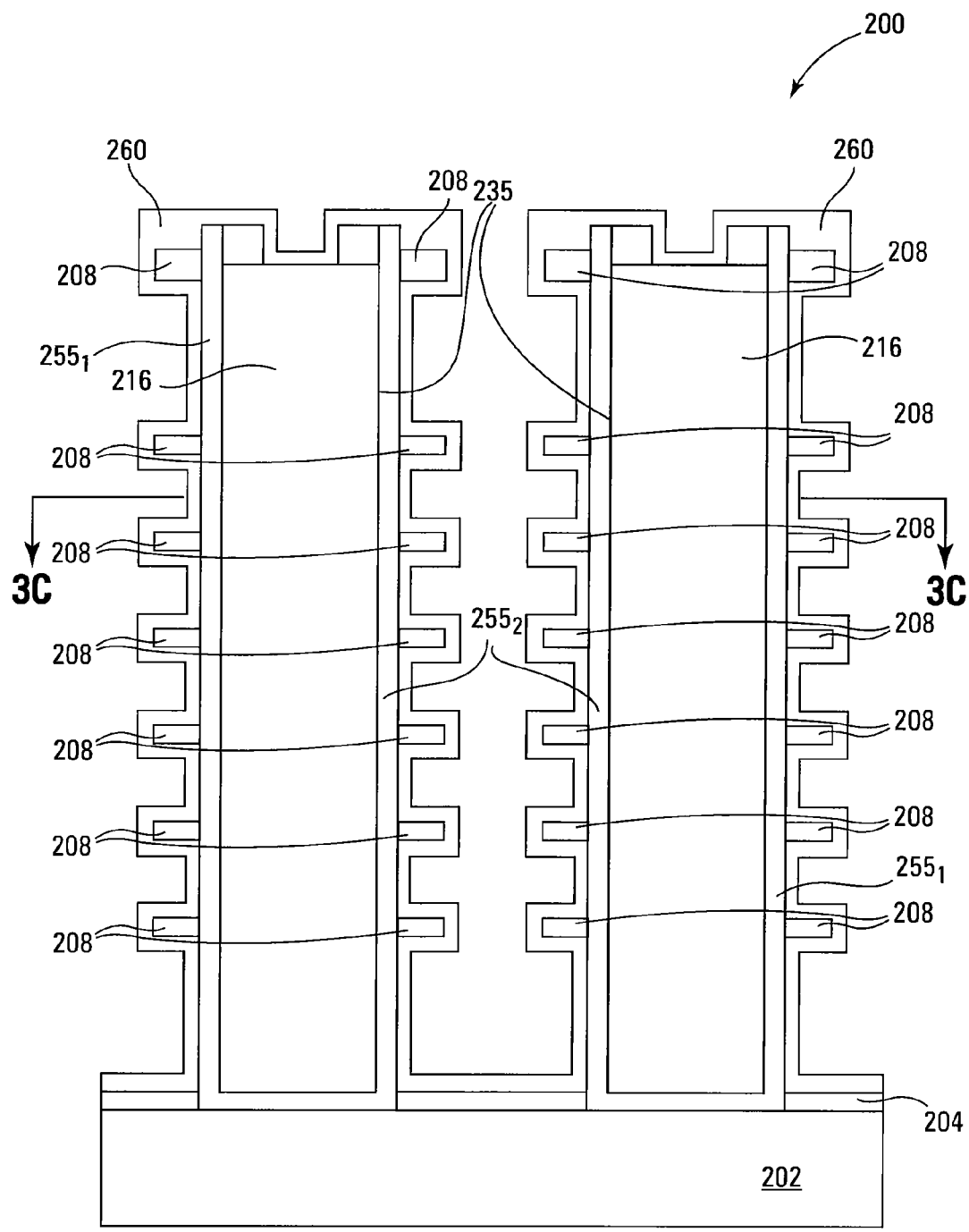

Sacrificial dielectrics 206 are then removed from dielectrics 204 and 208 and semiconductor structures $255_1$ and $255_2$, and sacrificial hard mask 210 is removed from a dielectric 208, e.g., using an etch selective to dielectrics 206 (e.g., and etch that is selective to nitride). This exposes dielectrics 204 and 208 and semiconductor structures $255_1$ and $255_2$. Then, a plurality of charge storage structures, such as those forming a continuous charge trap 260, are formed substantially concurrently (e.g., concurrently) adjacent to the dielectrics 204 and 208, semiconductor structures $255_1$ and $255_2$, and portions 230 of the substantially vertical (e.g., vertical) sidewalls of each pillar 235, as shown in FIGS. 2C and 3C, where FIG. 2C is a cross-section (cross-hatching omitted) of memory array 200 taken along line 2C-2C of FIG. 3C that is a cross-section (cross-hatching omitted) taken along line 3C-3C of FIG. 2C. For example, charge trap 260 may be formed by a conformal deposition process, such as chemical vapor deposition (CVD), atomic layer deposition (ALD), etc. Alternatively, charge trap 260 may be grown.

For some embodiments, charge trap 260 may include a tunnel dielectric, such as a tunnel oxide, formed adjacent to the dielectrics 204 and 208, semiconductor structures $255_1$ and $255_2$, and portions 230 of the substantially vertical (e.g., vertical) sidewalls of each pillar 235, charge trapping material, such as a nitride, formed adjacent to (e.g., on) the tunnel dielectric, and a blocking dielectric, such as a blocking oxide, formed adjacent to (e.g., on) the charge trapping material. For other embodiments, charge trap 260 may be a dielectric, e.g., a high-dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or SiON/$Si_3N_4$.

A conductor, e.g., a metal, such as tungsten, tantalum nitride, titanium nitride, tungsten nitride, etc., is formed adjacent to the structure of FIGS. 2C and 3C, e.g., using a conformal deposition process, such as chemical vapor deposition (CVD), atomic layer deposition (ALD), etc. In general, the conductor, may comprise, consist of, or consist essentially of conductively doped polysilicon and/or may comprise, consist of, or consist essentially of metal, such as a refractory metal, or a metal-containing material, such as a refractory metal silicide layer, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

Figure 2D:
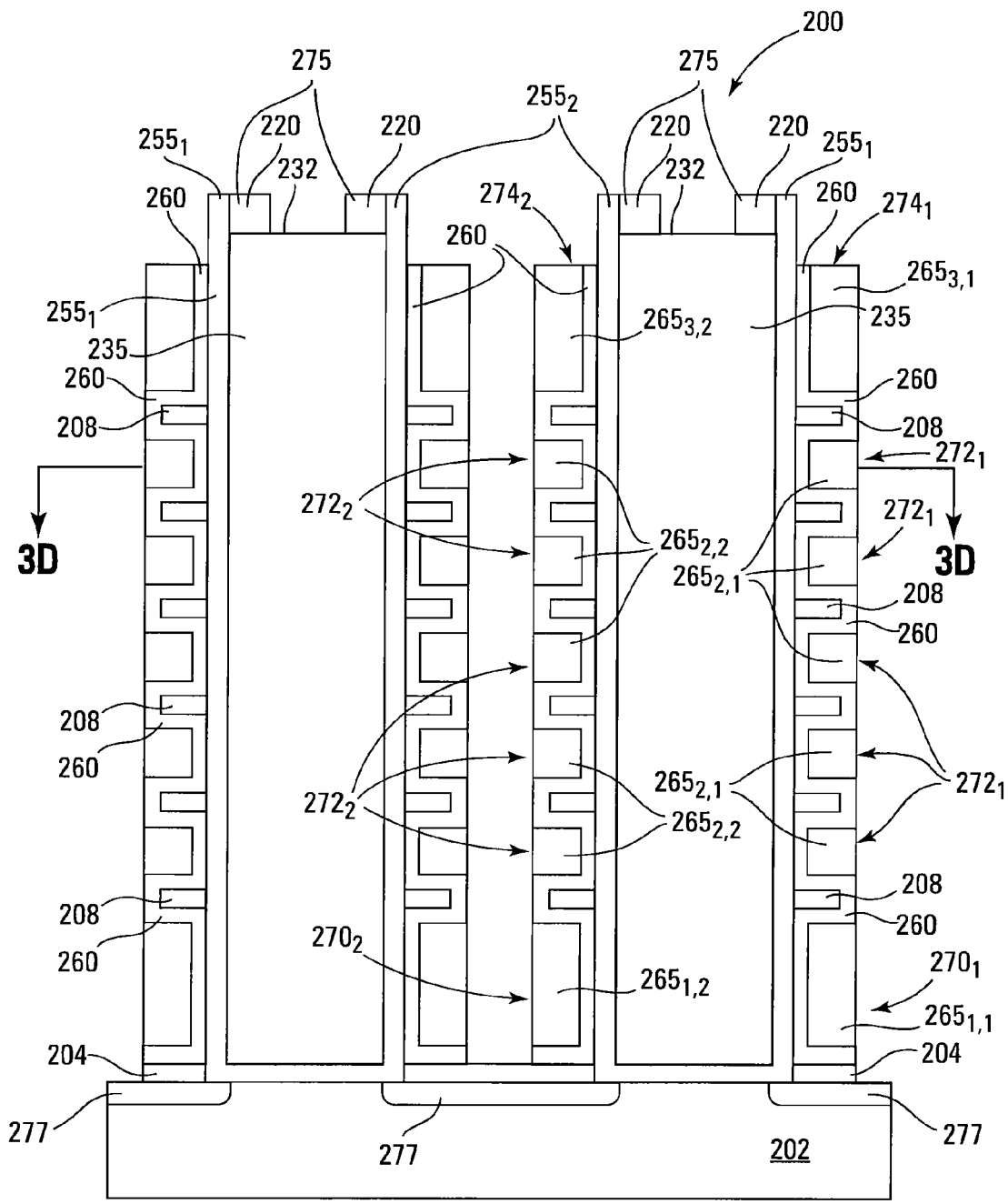
Figure 3D:
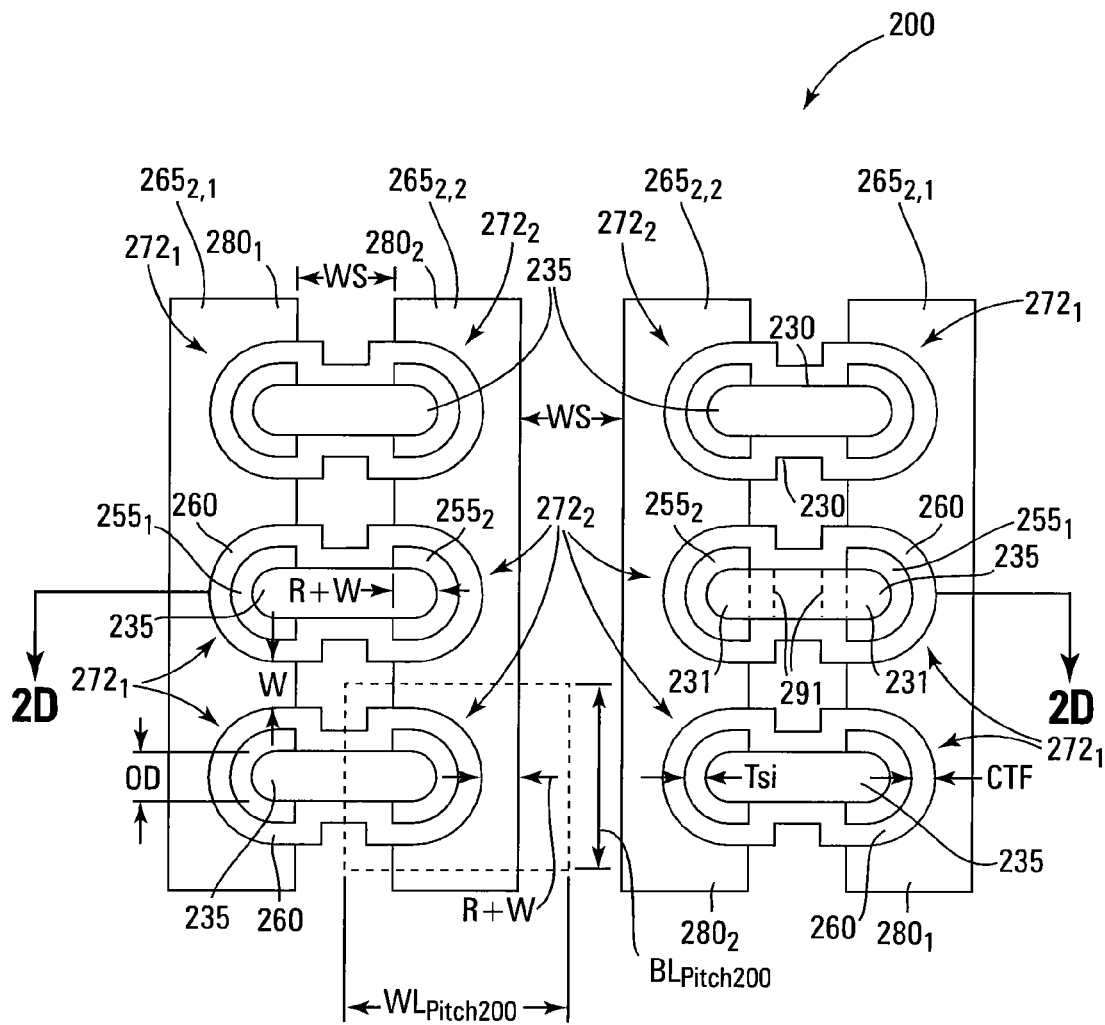

An etch-back, e.g., an anisotropic etch-back, is then performed to remove excess conductor to form control gates 265 from the remaining conductor, as shown in FIGS. 2D and 3D, where FIG. 2D is a cross-section (cross-hatching omitted) of memory array 200 taken along line 2D-2D of FIG. 3D that is a cross-section (cross-hatching omitted) taken along line 3D-3D of FIG. 2D.

Control gates $265_{1,1}$ and $265_{1,2}$ are respectively control gates of select gates, such as source select gates $270_1$ and $270_2$; control gates $265_{2,1}$ and $265_{2,2}$ are respectively control gates of memory cells (e.g., non-volatile memory cells) $272_1$ and $272_2$; and control gates $265_{3,1}$ and $265_{3,2}$ are respectively control gates of select gates, such as s drain select gates $274_1$ and $274_2$, as shown in FIGS. 2D and 3D. Control gates $265_{2,1}$ and $265_{2,2}$ may respectively form portions of access lines (e.g., word lines) $280_1$ and $280_2$, as shown in FIG. 3D. For example, control gates $265_{2,1}$ and $265_{2,2}$ may be respectively coupled to word lines $280_1$ and $280_2$. Similarly, control gates $265_{1,1}$ and $265_{1,2}$ respectively form portions of source select lines and control gates $265_{3,1}$ and $265_{3,2}$ respectively form portions of drain select lines. For example, control gates $265_{1,1}$ and $265_{1,2}$ may be respectively coupled to the source select lines, and control gates $265_{3,1}$ and $265_{3,2}$ may be respectively coupled to the drain select lines.

Note that a memory cell 272 is located at each intersection of a word line 280 and charge trap 260; a source select gate 270 is located at each intersection of a source select line and charge trap 260; and drain select gate 274 located at each intersection of a drain select line and charge trap 260. Also note that a word line $280_1$ is commonly coupled to the memory cells $272_1$ respectively on different pillars 235, and a word line $280_2$ is commonly coupled to the memory cells $272_2$ respectively on those different pillars 235, as shown in FIG. 3D.

A portion of charge trap 260 and a dielectric 208 thereunder and on a sidewall of semiconductor structure $255_1$ are interposed between successive control gates $265_{2,1}$ of successive memory cells $272_1$ of a string of memory cells $272_1$ and thus electrically isolate successive control gates $265_1$ of a string of memory cells $272_1$ from each other, as shown in FIG. 2D. A portion of charge trap 260 and a dielectric 208 thereunder and on a sidewall of semiconductor structure $255_2$ are interposed between successive control gates $265_{2,2}$ of successive memory cells $272_2$ of a string of memory cells $272_2$ and thus electrically isolate successive control gates $265_2$ of a string of memory cells $272_2$ from each other, as shown in FIG. 2D.

A portion of charge trap 260 and a dielectric 208 adjacent thereto and adjacent to a sidewall of semiconductor structure $255_1$ are interposed between the control gate $265_{1,1}$ of a source select gate $270_1$ and the control gate $265_{2,1}$ of a memory cell $272_1$ at one end of the string of memory cells $272_1$, electrically isolating those control gates, and between the control gate $265_{3,1}$ of a drain select gate $274_1$ and the control gate $265_{2,1}$ of the memory cell $272_1$ at the opposite end of the string of memory cells $272_1$, electrically isolating those control gates, as shown in FIG. 2D. A portion of charge trap 260 and a dielectric 208 adjacent thereto and adjacent to a sidewall of semiconductor structure $255_2$ are interposed between the control gate $265_{1,2}$ of a source select gate $270_2$ and the control gate $265_{2,2}$ of a memory cell $272_2$ at one end of the string of memory cells $272_2$, electrically isolating those control gates, and between the control gate $265_{3,2}$ of a drain select gate $274_2$ and the control gate $265_{2,2}$ of the memory cell $272_2$ at the opposite end of the string of memory cells $272_2$, electrically isolating those control gates. Note that portions of charge trap 260 are interposed between the sidewalls of semiconductor structures $255_1$ and $255_2$ and the control gates 265, electrically isolating the semiconductor structures $255_1$ and $255_2$ from control gates 265, as shown in FIGS. 2D and 3D.

For some embodiments, after the etch-back that forms the control gates, a portion of the charge trap 260, a dielectric 208, and a portion of dielectric 204 may be optionally removed, e.g., using a etch selective to the charge trap 260, dielectric 208, and dielectric 204. Removal of the portion of the charge trap 260 exposes a portion of the upper surface 232 of each of the pillars 235, portions of the semiconductor 220 over each of the pillars 235, the upper ends of semiconductor structures 255, portions of the sidewalls of semiconductor structures 255 adjacent their upper ends, and an upper surface of each of the control gates $265_{3,1}$ and $265_{3,2}$, as shown in FIG. 2D. The dielectric 208 is also removed from the portions of the sidewalls of semiconductor structures 255 adjacent their upper ends. Removal of the portion of dielectric 204 exposes portions of an upper surface of semiconductor 202.

Source/drain regions 275 (e.g., drains) may then be formed (e.g. implanted) in the exposed semiconductors 220 and the exposed portions of the sidewalls of semiconductor structures 255 adjacent their upper ends, as shown in FIG. 2D. Source/drain regions 277 (e.g., source lines) may be formed (e.g. implanted), e.g. substantially concurrently (e.g., concurrently) with source/drain regions 275, in the exposed portions of semiconductor 202. For example, source/drain regions 275 and 277 may be n-type when semiconductor 202 is p-type and p-type when semiconductor 202 is n-type. Source/drain regions 277 are electrically coupled to source select gates $270_1$ and $270_2$ by semiconductor structures 255.

For other embodiments, source/drain regions, such as source/drain regions 277, may be implanted in semiconductor 202 through openings 212 (FIG. 2A), e.g., using hard mask 210 as a mask or using the mask over hard mask 210 in the event that the mask is not yet removed. Alternatively, for some embodiments, a contiguous source/drain region (e.g., a plane) located under the openings 212 and dielectric 204 may replace source/drain regions 277 and may be implanted in semiconductor 202 before forming dielectric 204. For example, contiguous source/drain region may electrically coupled to source select gates $270_1$ and $270_2$ by semiconductor structures 255.

A dielectric (not shown), such as bulk insulation, may then be formed over the structure in FIG. 2D so that source/drain regions 275 and 277 are covered thereby. Openings may then be formed within the dielectric to expose source/drain regions 275. Contacts (not shown) may then be formed within the openings, e.g., so that a contact is in contact with each source/drain region. 275.

One example for the dielectric would be a doped silicate glass. Examples of doped silicate glasses include BSG (borosilicate glass), PSG (phosphosilicate glass), and BPSG (borophosphosilicate glass). Another example for the dielectric would be TEOS (tetraethylorthosilicate). The contacts may comprise, consist of, or consist essentially of a metal or metal-containing layer and may be aluminum, copper, a refractory metal, or a refractory metal silicide layer. In some embodiments, the conductor may contain multiple metal-containing layers, e.g., a titanium nitride (TiN) barrier layer formed over (e.g., in direct physical contact with) a source/drain region 275, a titanium (Ti) adhesion layer formed over the barrier layer, and a tungsten (W) layer formed over the adhesion layer.

A conductor (not shown) that may be metal, such as aluminum, may then be formed over the dielectric formed over the structure of FIG. 2D. The conductor is patterned, etched, and processed, e.g., using standard processing, to produce individual data lines, such as bit lines, that are electrically connected to the contacts, and thus the source/drain regions 275 and drain select gates $274_1$ and $274_2$.

Semiconductor structures $255_1$ and $255_2$ respectively form channel regions of memory cells $272_1$ and $272_2$ and respectively electrically couple memory cells $272_1$ and $272_2$ in series to form strings (e.g., NAND strings) of memory cells $272_1$ and $272_2$. In other words, during operation of a string of memory cells $272_1$, a channel(s) can be formed in a semiconductor structure $255_1$, and during operation of a string of memory cells $272_2$, a channel(s) can be formed in a semiconductor structure $255_2$. Semiconductor structure $255_1$ electrically couples a string of memory cells $272_1$ in series to a source select gate $270_1$ at one end of that string and a drain select gate $274_1$ in series to the opposite end of that string, and semiconductor structure $255_2$ electrically couples a string of memory cells $272_2$ in series to a source select gate $270_2$ at one end of that string and a drain select gate $274_1$ in series to the opposite end of that string, as shown in FIG. 2D.

A string of memory cells $272_1$ and the source select gate $270_1$ and the drain select gate $274_1$ coupled to the ends thereof are located adjacent to the same portion of the sidewall (e.g., the same side) of a respective pillar 235, and a string of memory cells $272_2$ and the source select gate $270_2$ and the drain select gate $274_2$ coupled to the ends thereof are located adjacent to the same opposite portion of the sidewall (e.g., the same opposite side) of a respective pillar 235. In addition, the word lines $280_1$ coupled to memory cells $272_1$ are coupled to the same portion of the sidewall (e.g., the same side) of charge trap 260, and the word lines $280_2$ coupled to memory cells $272_2$ are coupled to the same opposite portion of the sidewall (e.g., the same opposite side) of charge trap 260.

A source select gate $270_1$ and a drain select gate $274_1$ and the string of memory cells $272_1$ electrically coupled thereto are formed adjacent to a first portion of the substantially vertical (e.g., vertical) sidewall each pillar 235. A source select gate $270_2$ and a drain select gate $274_2$ and the string of memory cells $272_2$ electrically coupled thereto are formed adjacent to a second portion of the substantially vertical (e.g., vertical) sidewall the respective pillar 235, as shown in FIGS. 2D and 3D. That is, there are two strings of memory cells on each pillar 235.

Each memory cell $272_1$ includes a portion of semiconductor structure $255_1$, as a channel region thereof, adjacent to (e.g., in direct contact with) an outer surface of the first portion of the sidewall of a respective pillar 235, a portion of a charge trap 260 adjacent to the portion of semiconductor structure $255_1$, and a control gate $265_{2,1}$ adjacent to the portion of charge trap 260, as shown in FIGS. 2D and 3D. Each memory cell $272_2$ includes a portion of semiconductor structure $255_2$, as a channel region thereof adjacent to (e.g., in direct contact with) an outer surface of the second portion of the sidewall of the respective pillar 235, an other portion of the charge trap 260 adjacent to the portion of the semiconductor structure $255_2$, and a control gate $265_{2,2}$ adjacent to the other portion of the charge trap 260, as shown in FIGS. 2D and 3D.

The control gates $265_{2,1}$ and $265_{2,2}$ respectively of memory cells $272_1$ and $272_2$ are formed adjacent to opposing portions of charge trap 260, e.g., the portions that respectively wrap around opposing portions of the sidewall of each pillar 235. For example, two memory cells, such as memory cells $272_1$ and $272_2$, may respectively wrap around opposing portions of the sidewall of each pillar 235, e.g., and as such, may be termed "half-wrap" memory cells. Control gates $265_{2,1}$ and $265_{2,2}$ may be electrically isolated from each other, e.g., by a dielectric (not shown), e.g., bulk insulation, that may be formed between control gates $265_{2,1}$ and $265_{2,2}$, and thus the word lines $280_1$ and $280_2$. Adjacent word lines $280_2$ may be similarly electrically isolated from each other.

For some embodiments, charge trap 260 may form a contiguous structure that is wrapped completely around the periphery of a respective pillar 235, including the semiconductor structures $255_1$ and $255_2$. For example, the portions of charge trap 260 respectively adjacent to semiconductor structures $255_1$ and $255_2$ may be contiguous. Portions of the charge trap 260 may be interposed between a semiconductor structure $255_1$ and a semiconductor structure $255_2$. For example, the portions of charge trap 260 interposed between a semiconductor structure $255_1$ and a semiconductor structure $255_2$ may be respectively in direct contact with opposing portions 230 of the sidewall of the respective pillar 235, as shown in FIG. 3D.

For other embodiments, a portion of the charge traps 260 located between word lines $280_1$ and $280_2$ may be removed, e.g., using an isotropic etch, after forming the individual word lines $280_1$ and $280_2$. This separates a charge trap 260 into separated first and second portions respectively adjacent to semiconductor structures $255_1$ and $255_2$.

For example, in embodiments where semiconductor fills openings 212, dielectric 216, and thus dielectric pillars 235, is omitted, and structures $255_1$ and $255_2$ are semiconductor pillars that include semiconductor portions 231, as shown in FIGS. 3C and 3D, the separated first and second portions of the charge trap 260 may wrap (e.g., completely) around the structures $255_1$ and $255_2$, as indicated by dashed lines 291 in FIG. 3D, with the portion of charge trap 260 and dielectric pillar 235 between dashed lines 291 being omitted.

Source select gates $270_1$ and $270_2$ and drain select gates $274_1$ and $274_2$ have substantially the same (e.g., the same) cross-sections as those shown for memory cells 272 in FIG. 3D. For example, a source select gate $270_1$ may include a portion of semiconductor structure $255_1$, as a channel region thereof, adjacent to the first portion of the sidewall of a respective pillar 235, a portion of a charge trap 260 adjacent to the portion of semiconductor structure $255_1$, and a control gate $265_{1,1}$ adjacent to the portion of charge trap 260, as shown in FIG. 2D. A source select gate $270_2$ may include a portion of a semiconductor structure $255_2$, as a channel region thereof, adjacent to the second portion of the sidewall of a respective pillar 235, a portion of a charge trap 260 adjacent to the portion of semiconductor structure $255_2$, and a control gate $265_{1,2}$ adjacent to the portion of charge trap 260, as shown in FIG. 2D. A drain select gate $274_1$ may include a other portion of semiconductor structure $255_1$, as a channel region thereof, adjacent to the first portion of the sidewall of a respective pillar 235, an other portion of a charge trap 260 adjacent to the other portion of semiconductor structure $255_1$, and an other portion control gate $265_{3,1}$ adjacent to the other portion of charge trap 260, as shown in FIG. 2D. A drain select gate $274_2$ may include an other portion of semiconductor structure $255_2$, as a channel region thereof, adjacent to the second portion of the sidewall of a respective pillar 235, an other portion of charge trap 260 adjacent to the other portion of semiconductor structure $255_2$, and a control gate $265_{3,2}$ adjacent to the other portion of charge trap 260, as shown in FIG. 2D. The source and drain select gates can be programmable, i.e., capable of altering their threshold voltages, and may be programmed or left unprogrammed.

FIGS. 4A-4E and 5A-5E are cross-sectional views of a portion of a memory array 400, during various stages of fabrication, according to other embodiments. Memory array 400 may form a portion of memory array 104 of FIG. 1. Common numbering is used in FIGS. 4A-4E and 5A-5E and in FIGS. 2A-2D and 3A-3D to denote similar (e.g., the same) components.

Figure 4A:
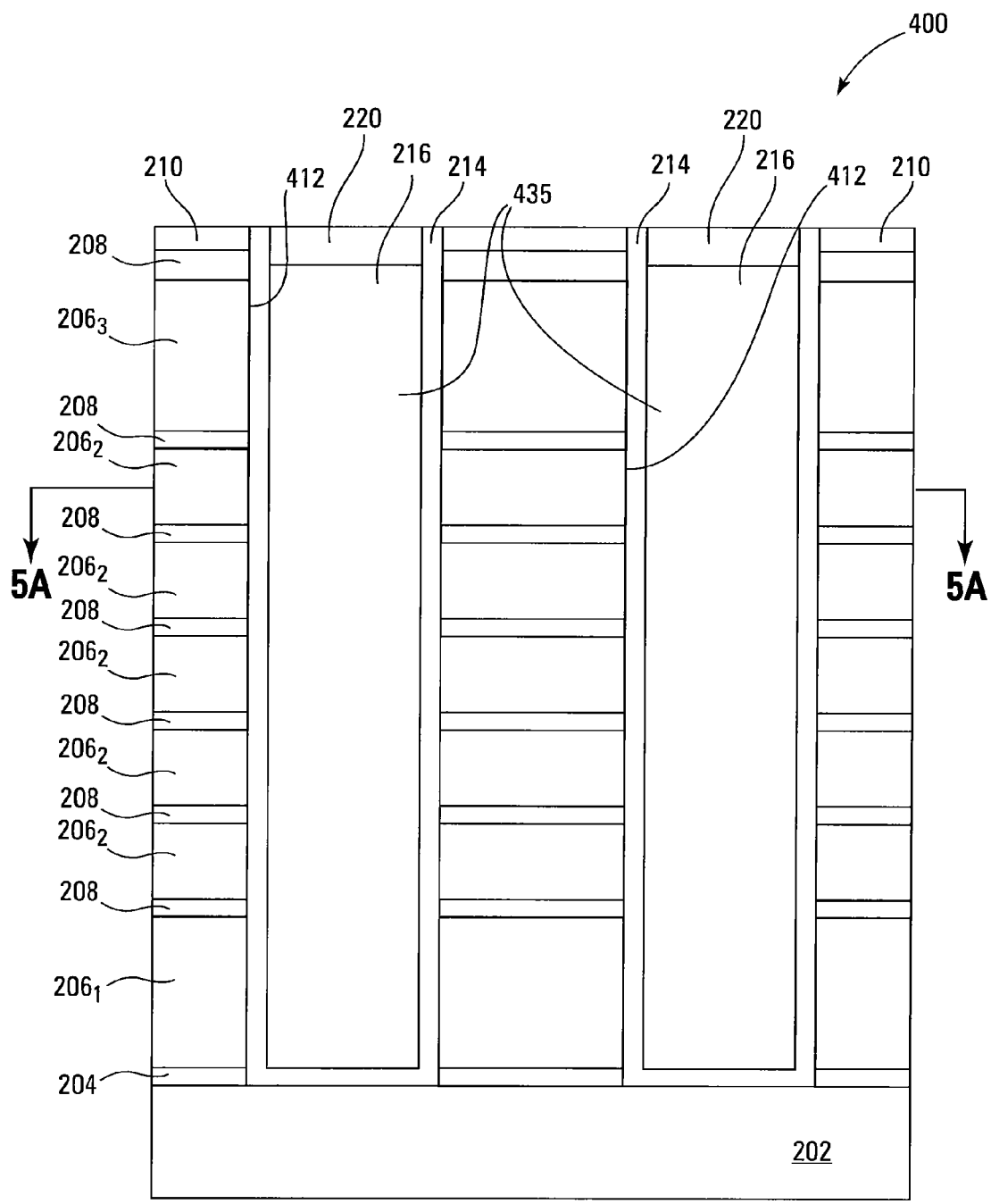
FIGS. 4A-4E are cross-sectional views of a memory array during various stages of fabrication, according to another embodiment.
Figure 5A:
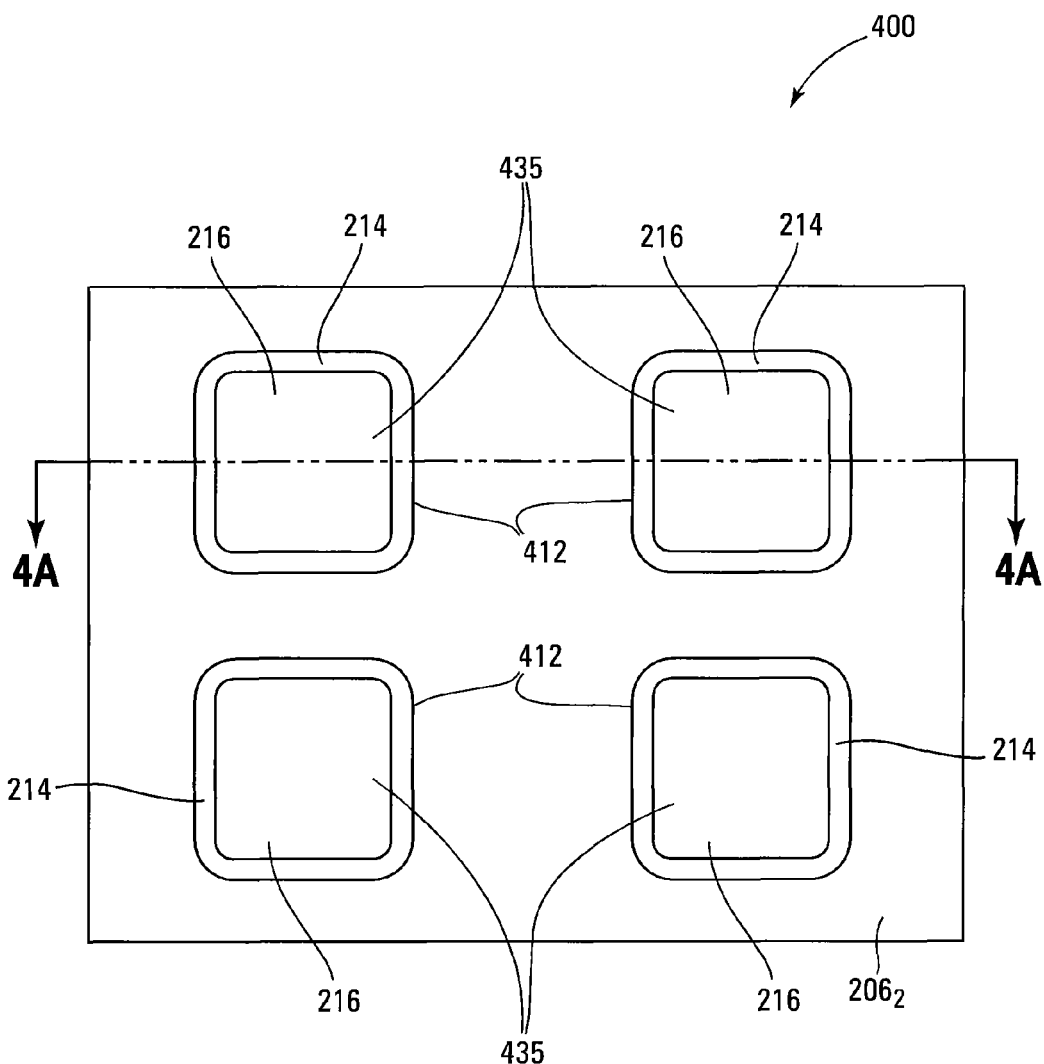
FIGS. 5A-5E are cross-sectional views respectively corresponding to FIGS. 4A-4E.

FIG. 4A is a cross-section (cross-hatching omitted) of memory array 400 taken along line 4A-4A of FIG. 5A that is a cross-section (cross-hatching omitted) taken along line 5A-5A of FIG. 4A. The formation of the structure of FIGS. 4A and 5A may be substantially the same as the formation of the structure of FIGS. 2A and 3A, as described above.

Openings 412 may be formed, e.g., as described above in conjunction with FIGS. 2A and 3A for openings 212, except that the shape of the cross-sections of openings 412 in FIG. 5A differs from the shape of the cross-sections openings 212 in FIG. 3A. Semiconductor 214 is formed in openings 412 so as to line or fill openings 412, e.g., as described above in conjunction with FIGS. 2A and 3A for openings 212, except that the shape of the cross-sections of semiconductor 214 in FIG. 5A differs from the shape of the cross-sections of semiconductor 214 in FIG. 3A. In embodiments where openings 412 are only lined with the semiconductor 214, substantially vertical (e.g., vertical) dielectric pillar structures 435 are formed within openings 212 from dielectric 216, e.g., as described above in conjunction with FIGS. 2A and 3A for pillars 235, except the shape of the cross-sections of pillar structures 435 in FIG. 5A differs from the shape of the cross-sections pillars 235 in FIG. 3A.

Figure 4B:
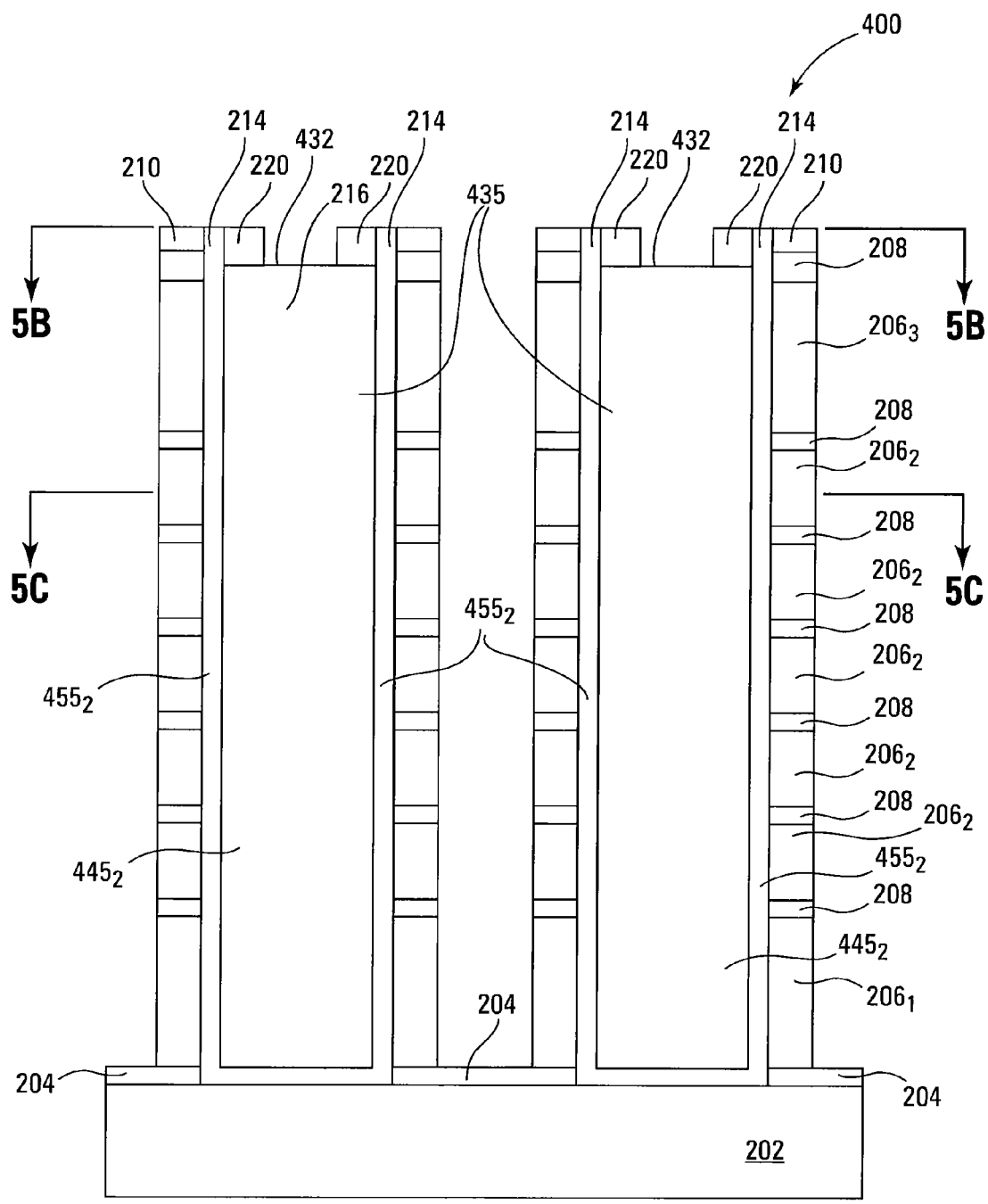
Figure 5B:
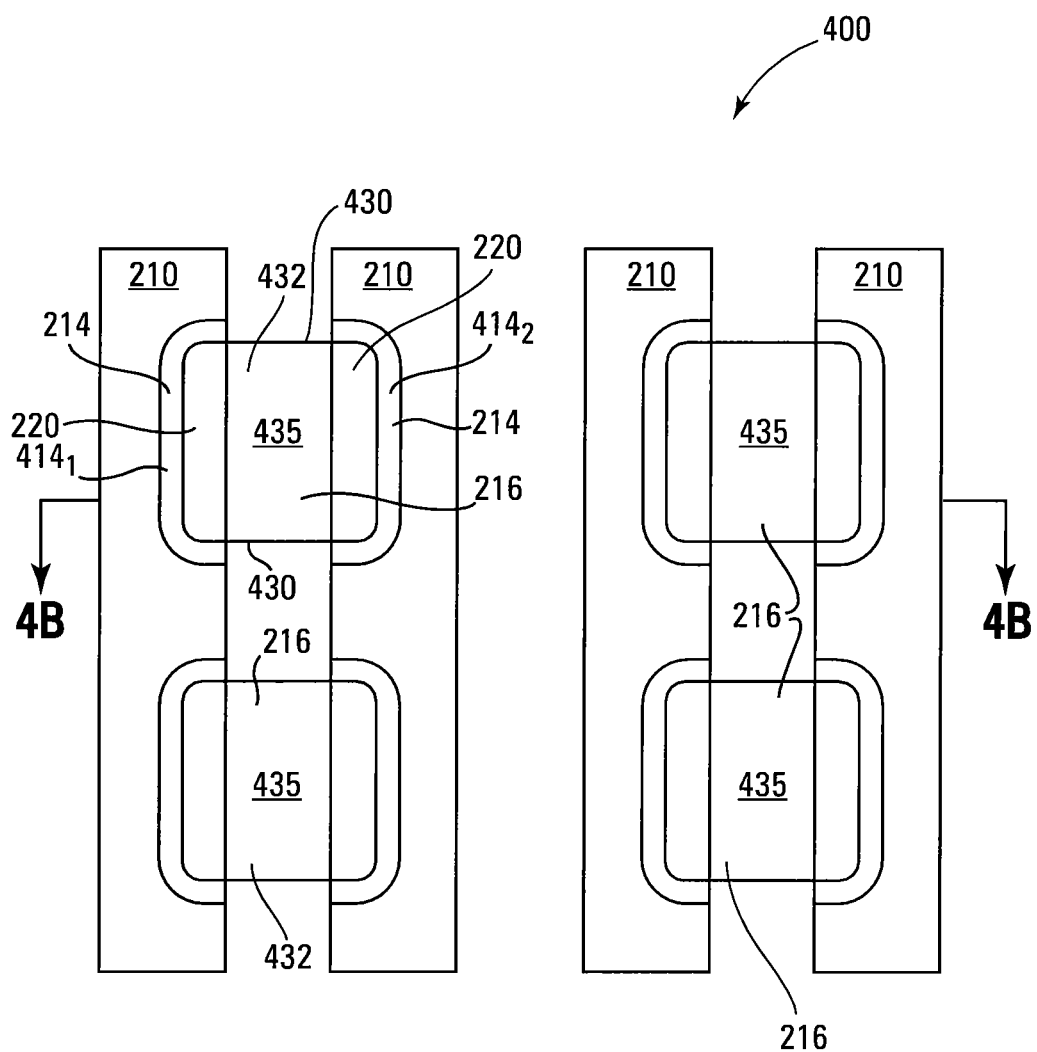

FIG. 4B is a cross-section (cross-hatching omitted) of memory array 400 taken along line 4B-4B of FIG. 5B that is a cross-section (cross-hatching omitted) taken along line 5B-5B of FIG. 4B. The formation of the structure of FIGS. 4B and 5B may be substantially the same as the formation of the structure of FIGS. 2B and 3B, as described above. For example, a mask (not shown), e.g., of photoresist, may be formed over the structure of FIG. 4A and patterned for exposing portions of hard mask 210 and the dielectrics 206 and 208 under those exposed portions of hard mask 210, a portion of semiconductor 220, and portions of semiconductor 214, e.g., portions of the substantially vertical (e.g., vertical) sidewalls of semiconductor 214.

The exposed portions of hard mask 210 and the dielectrics 206 and 208 are then removed, e.g., as described above in conjunction with FIGS. 2B and 3B. Subsequently, the exposed portion of semiconductor 220 (FIG. 4B) and portions of semiconductor 214, e.g., portions of the substantially vertical (e.g., vertical) sidewalls of semiconductor 214 (FIG. 5B), are removed, e.g., as described above in conjunction with FIGS. 2B and 3B, stopping on or within dielectrics 204 and 216. For example, the removal of the portion of semiconductor 220 stops on or within dielectric 216 and the removal of the portions of the substantially vertical sidewalls of semiconductor 214 stops on or within dielectric 204. The etch that removes the portion of semiconductor 220 and the portions of semiconductor 214 may have a different chemistry than and may be performed in situ with the etch that removes portions of hard mask 210 and the dielectrics 206 and 208.

The removal of the portions of the substantially vertical (e.g., vertical) sidewalls of semiconductor 214 exposes portions 430 of the substantially vertical (e.g., vertical) sidewalls of each pillar structure 435, as shown in FIG. 5B, and removal of the portion of semiconductor 220 exposes a portion of an upper surface 432 of each pillar structure 435, as shown in FIGS. 4B and 5B. Note that portions of sacrificial dielectrics 206, portions of dielectrics 204 and 208, and portions of hard mask 210 remain adjacent to (e.g., on) the sidewalls of semiconductor 214, i.e., adjacent to the substantially vertical (e.g., vertical) sidewalls of semiconductor 214.

Removal of semiconductor 214 from the portions 430 of the substantially vertical (e.g., vertical) sidewalls of each pillar structure 435 forms two separated opposing, substantially vertical (e.g., vertical) adjacent semiconductor structures $414_1$ and $414_2$ adjacent to (e.g., on) the remainder of the substantially vertical (e.g., vertical) sidewalls of each pillar structure 435 from semiconductor 214, as shown in FIGS. 4B and 5B. For example, opposing portions 430 of the sidewall of a pillar structure 435 are interposed between and separate semiconductor structures $414_1$ and $414_2$ from each other. Note that portions of semiconductor 220 that are separated by the removal of the portion thereof are respectively electrically coupled (e.g. by direct physical contact with) to semiconductor structures $414_1$ and $414_2$, as shown in FIGS. 4B and 5B.

Figure 4C:
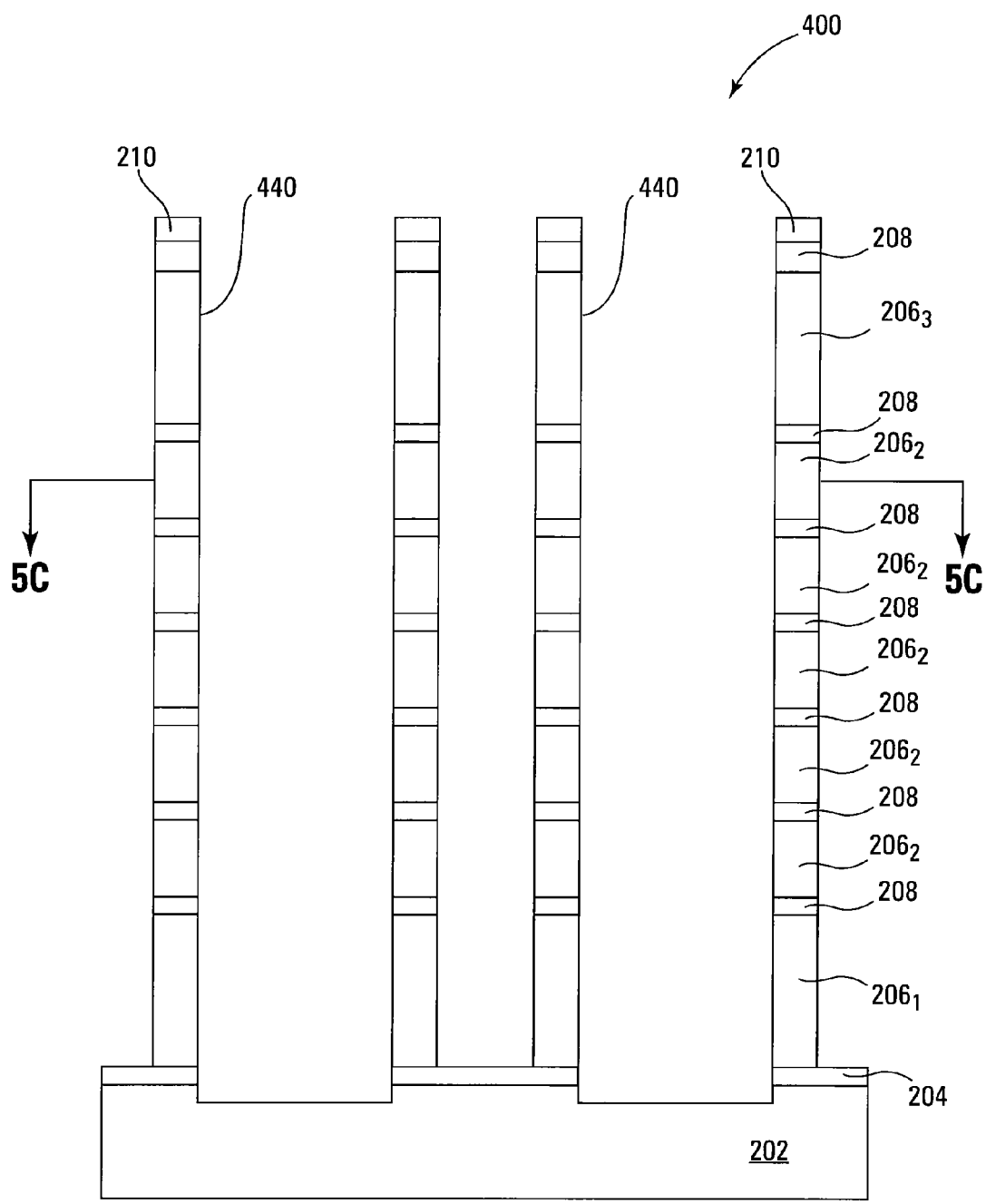
Figure 5C:
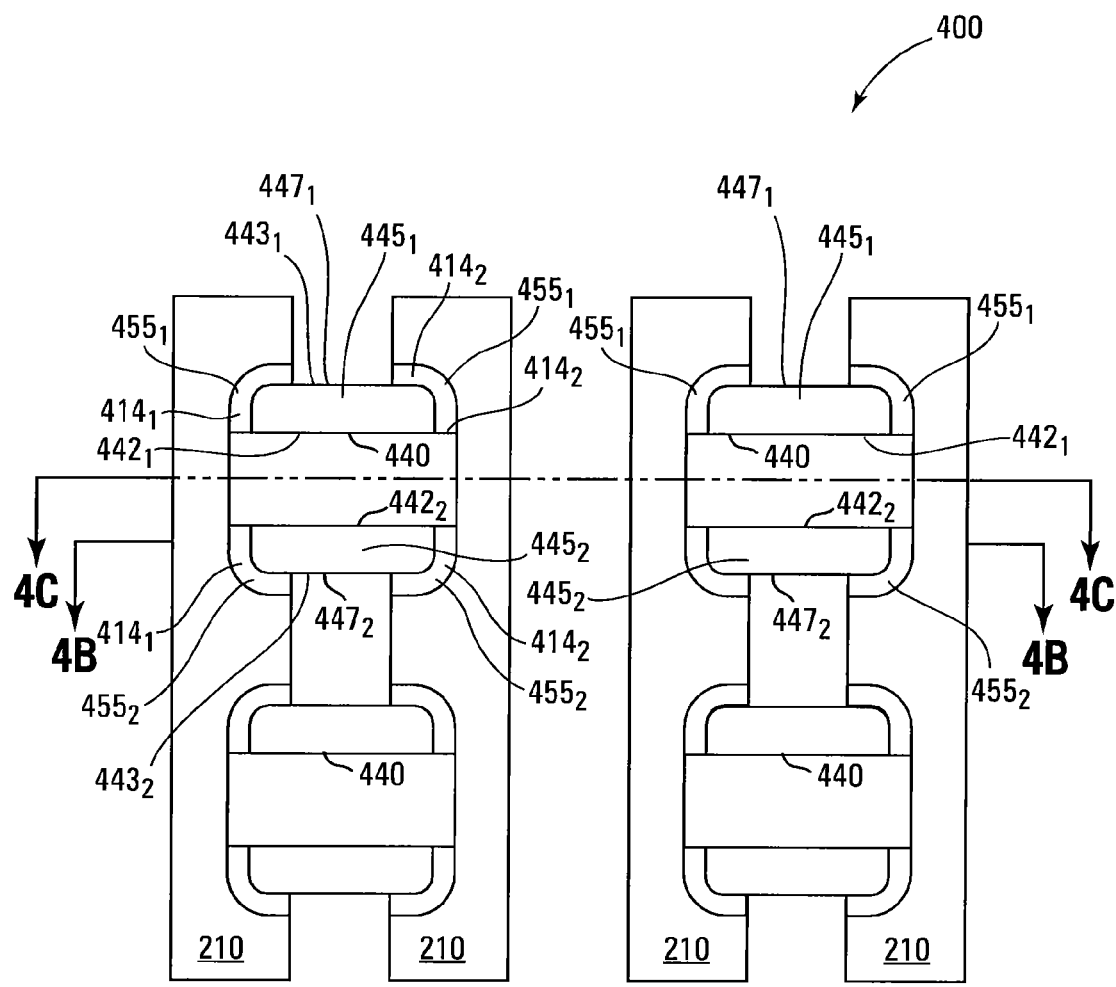

The structure of FIGS. 4B and 5B may then be patterned to form the structure of FIGS. 4C and 5C, where FIG. 4C is a cross-section (cross-hatching omitted) of memory array 400 taken along line 4C-4C of FIG. 5C that is a cross-section (cross-hatching omitted) taken along line 5C-5C of FIG. 4C. For example, a mask (not shown), e.g., of photoresist, may formed over the structure of FIGS. 4B and 5B and patterned for forming openings 440, e.g., for removal of a portion of semiconductor structures $414_1$ and $414_2$, a portion of semiconductor 220 over each pillar, and a portion of each pillar structure 435. For example, an opening 440 is formed through dielectric 216 and extends through semiconductor structures $414_1$ and $414_2$, as shown in FIG. 5C.

A portion each semiconductor 220 over a pillar structure 435 and a portion of each of semiconductor structures $414_1$ and $414_2$ that extends above the upper surface 432 of each pillar structure 435 patterned for removal are then removed, such as by etching (e.g., using an etch that is selective to polysilicon), stopping on or within a respective pillar structure 435, thereby forming an upper portion of a respective opening 440. Subsequently, a remaining portion of each of semiconductor structures $414_1$ and $414_2$ patterned for removal and a portion of each pillar is removed, such as by etching (e.g., using an etch chemistry different than that used for forming upper portion of a respective opening 440), stopping on or within semiconductor 202, thereby forming the remainder of each opening 440.

The formation of each opening 440 forms two separate pillars $445_1$ and $445_2$ from each pillar structure 435, as shown in FIG. 5C. The formation of each opening 440 also forms a semiconductor structure $455_1$ and a semiconductor structure $455_2$ from each semiconductor structure $414_1$ that are separated from each other and a semiconductor structure $455_1$ and a semiconductor structure $455_2$ from each semiconductor structure $414_2$ that are separated from each other. Semiconductor structures $455_1$ are respectively adjacent to (e.g., on) opposing portions of the sidewall (e.g., opposite corners) of each pillar $445_1$ and are separated from each other, as shown in FIG. 5C. Semiconductor structures $455_2$ are respectively adjacent to (e.g., on) opposing portions (e.g., opposite corners) of the sidewall each pillar $445_2$ and are separated from each other, as further shown in FIG. 5C. This means that there are semiconductor structures $455_1$ respectively on opposite corners of each of pillars $445_1$, and there are semiconductor structures $455_2$ respectively on opposite corners of each of pillars $445_2$.

For example, the combination of the removal of semiconductor 214 from the portion 430 of the sidewall of each pillar structure 435 (FIG. 5B) and the formation of each opening 440 (FIG. 5C) forms four separate conductors from the semiconductor 214 on each pillar structure 435. Note that semiconductor structures $455_2$ and $455_2$ may remain connected together by the bottom of semiconductor 214, located under a respective pillar $455_2$, as shown in FIG. 4B. Similarly, semiconductor structures $455_1$ and $455_1$ may remain connected together by the bottom of semiconductor 214, located under a respective pillar $455_1$ (not shown). The ends of each semiconductor structure 455 may be respectively intersected by planes that are substantially perpendicular (e.g., perpendicular) to each other, as shown in FIG. 5C, e.g., the ends may be about 90 degrees apart.

The portion of semiconductor 220 that is coupled to semiconductor structure $414_1$ is cut into two parts during the formation of opening 440 so that the two parts are respectively electrically coupled to (e.g., by direct physical contact with) a set of semiconductor structures $455_1$ and $455_2$. The portion of semiconductor 220 that is coupled to semiconductor structure $414_2$ is also cut into two parts during the formation of opening 440 so that the two parts are respectively electrically coupled to (e.g., by direct physical contact with) a set of semiconductor structures $455_1$ and $455_2$.

Each pillar $445_1$ has a substantially vertical (e.g., vertical) sidewall $443_1$, and each pillar $445_2$ has a substantially vertical (e.g., vertical) sidewall $443_2$, as shown in FIGS. 4C and 5C. Each sidewall $443_1$ has an exposed substantially vertical (e.g., vertical) portion $442_1$ and an exposed substantially vertical (e.g., vertical) portion $447_1$ that is the same as an exposed portion 430 of the single pillar structure 435. Remaining portions of each sidewall $443_1$, e.g., other than portions $442_1$ and $447_1$, are covered by semiconductor structures $455_1$. Each sidewall $443_2$ has an exposed substantially vertical (e.g., vertical) portion $442_2$ and an exposed substantially vertical (e.g., vertical) portion $447_2$ that is the same as another exposed portion 430 of the single pillar structure 435. Remaining portions of each sidewall $443_2$, e.g., other than portions $442_2$ and $447_2$, are covered by semiconductor structures $455_2$. Note that the exposed portions 442 and 447 may face in opposite directions.

Note that the cross-section taken along line 4B-4B in FIG. 5C and shown in FIG. 4B is substantially unaffected (e.g., unaffected) by the formation of openings 440. That is, the cross-section taken along line 4B-4B in FIG. 5B before the formation of openings 440 and the cross-section taken along line 4B-4B in FIG. 5C after the formation of openings 440 remains substantially the same (e.g., the same), as is apparent from using FIG. 4B to correspond to both the cross-sections taken along lines 4B-4B in FIGS. 5B and 5C.

Figure 4D:
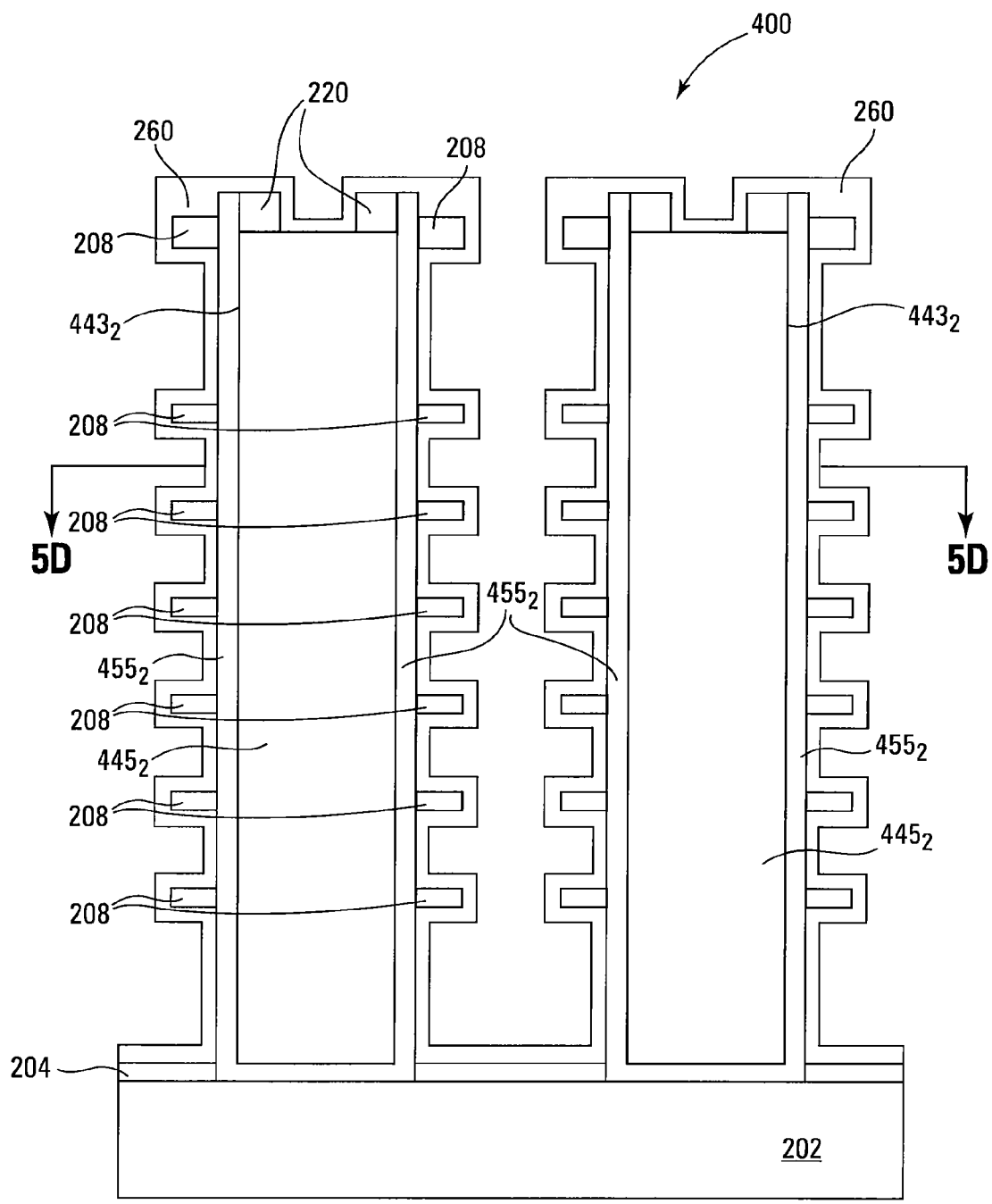
Figure 5D:
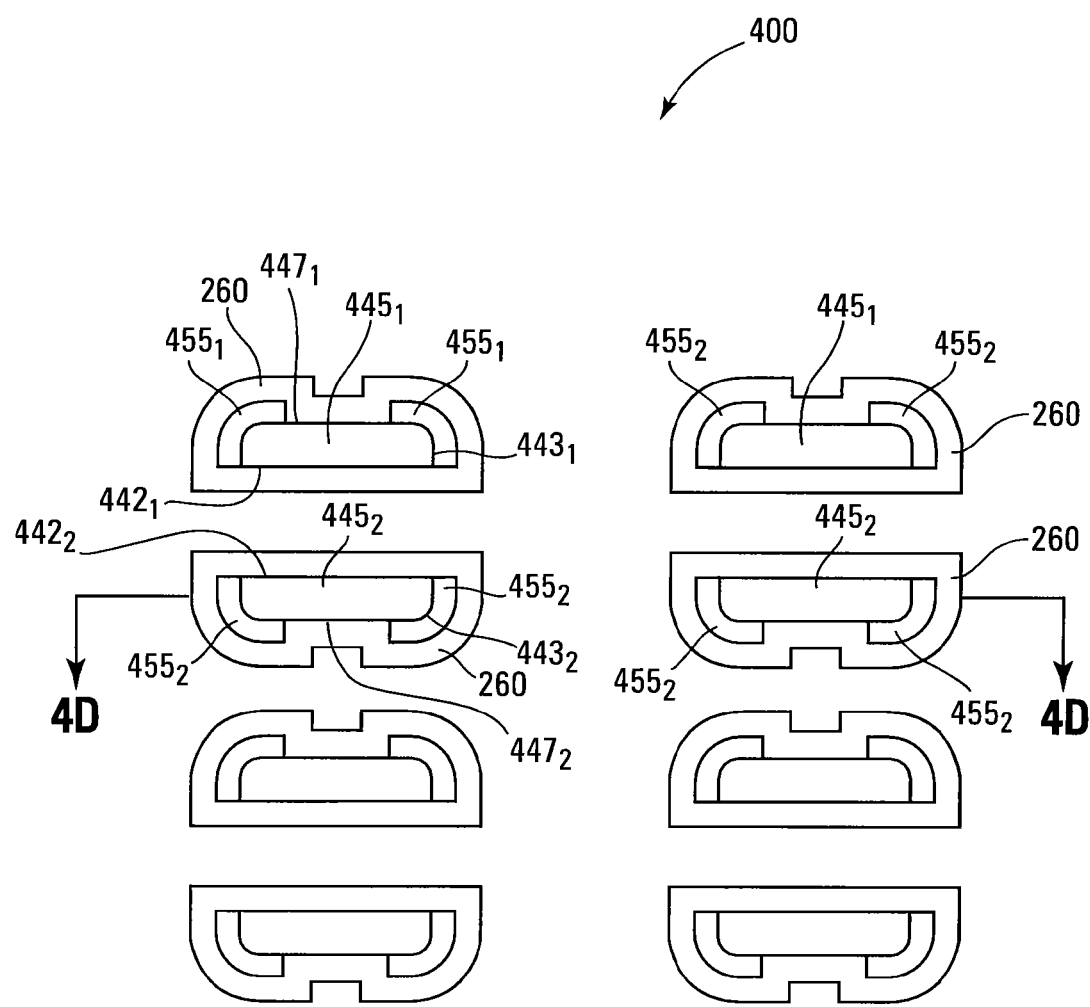

FIG. 4D is a cross-section (cross-hatching omitted) of memory array 400 taken along line 4D-4D of FIG. 5D that is a cross-section (cross-hatching omitted) taken along line 5D-5D of FIG. 4D. The formation of the structure of FIGS. 4D and 5D may be substantially the same as the formation of the structure of FIGS. 2C and 3C, as described above. For example, sacrificial dielectrics 206 are then removed from dielectrics 204 and 208 and semiconductor structures $455_1$ and $455_2$, and sacrificial hard mask 210 is removed from a dielectric 208, e.g., as described above in conjunction with FIGS. 2C and 3C. This exposes dielectrics 204 and 208 and semiconductor structures $455_1$ and $455_2$. Then, a plurality of charge storage structures, such as those forming a continuous charge trap 260, is formed substantially concurrently (e.g., concurrently) adjacent to the dielectrics 204 and 208, semiconductor structures $455_1$ and $455_2$, and portions 442 and 447 of the substantially vertical (e.g., vertical) sidewalls 443 of each pillar 445, as shown in FIGS. 4D and 5D, e.g., as described above in conjunction with FIGS. 2C and 3C.

Figure 4E:
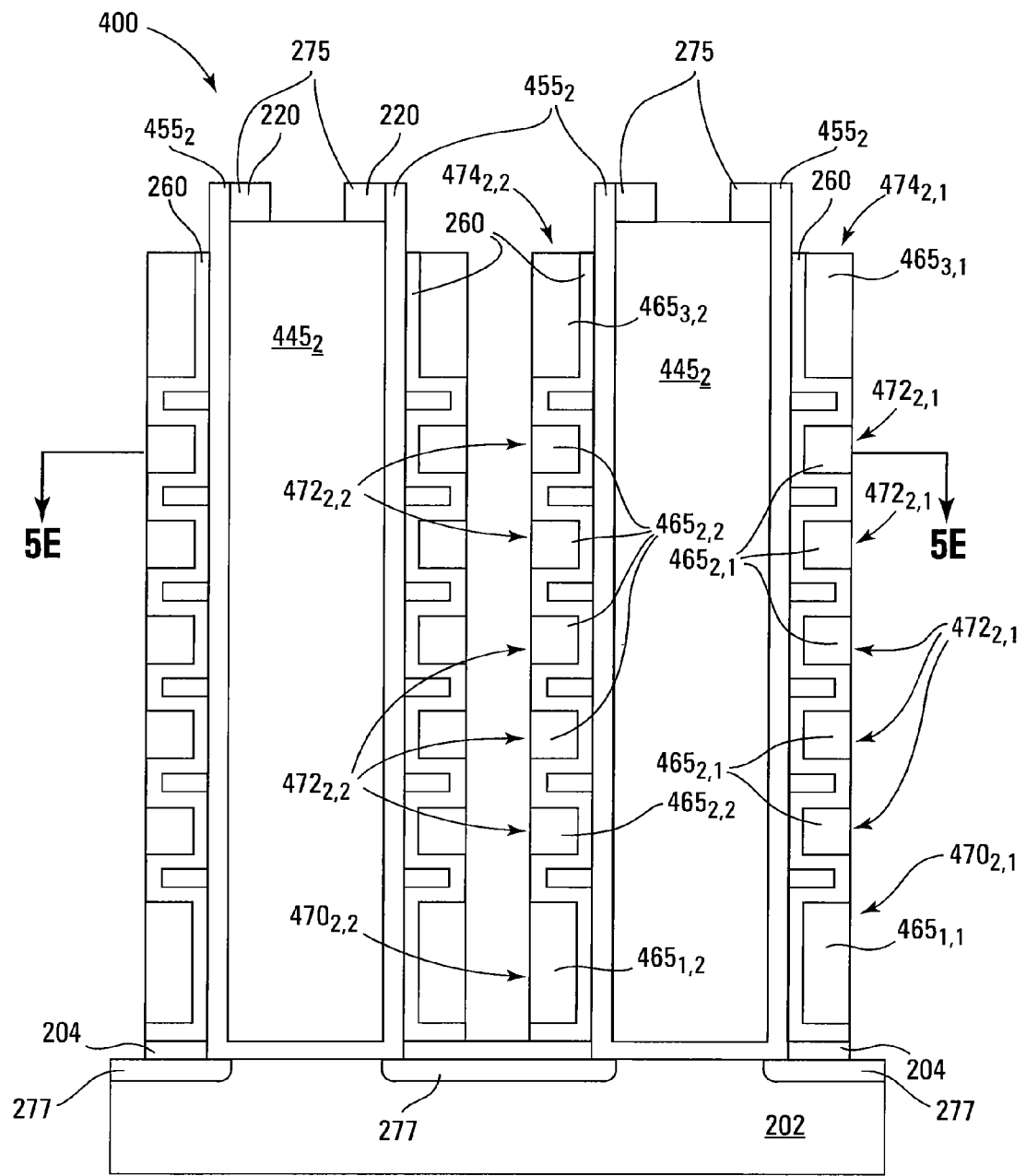
Figure 5E:
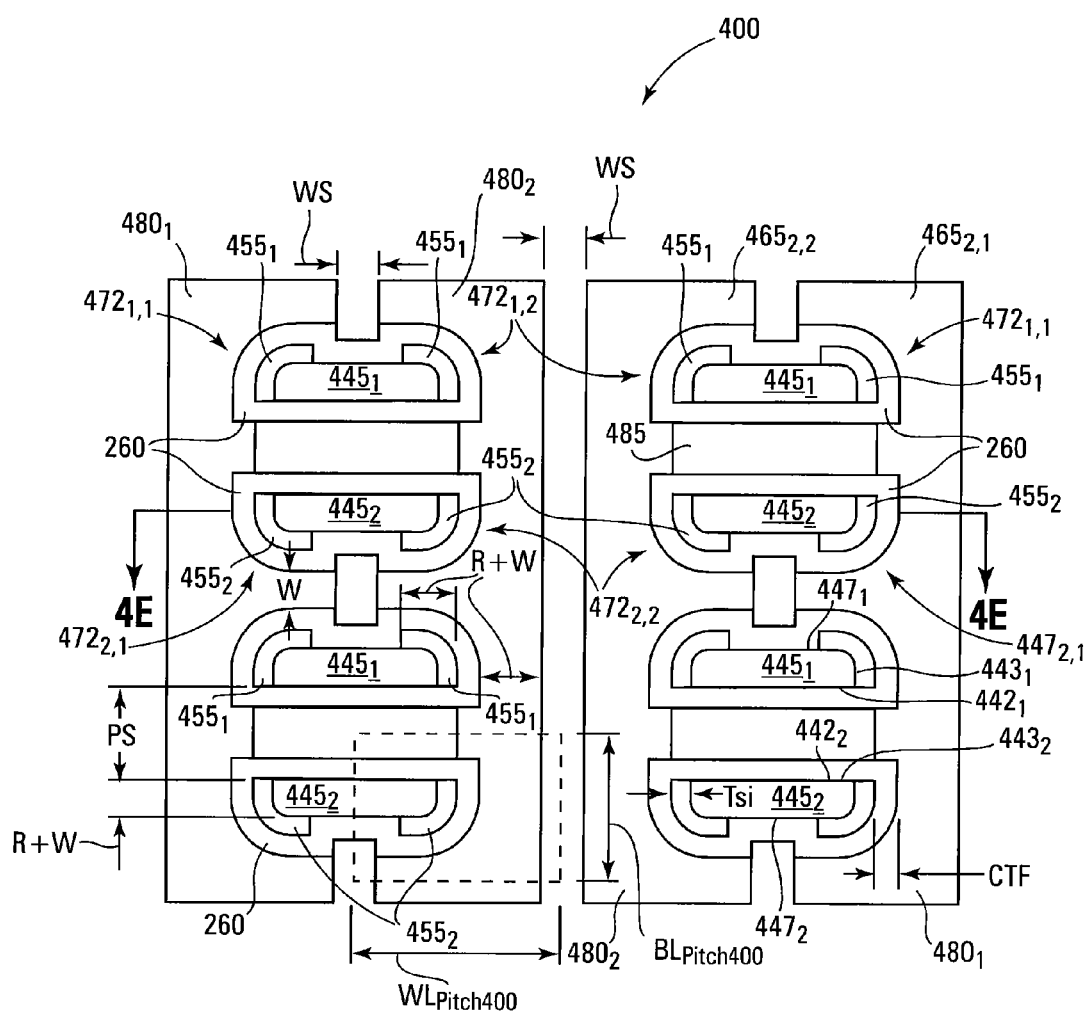

FIG. 4E is a cross-section (cross-hatching omitted) of memory array 400 taken along line 4E-4E of FIG. 5E that is a cross-section (cross-hatching omitted) taken along line 5E-5E of FIG. 4E. The formation of the structure of FIGS. 4E and 5E may be substantially the same as the formation of the structure of FIGS. 2D and 3D, as described above. For example, control gates 465 are formed from a conductor, e.g., as described above in conjunction with FIGS. 2D and 3D for control gates 265.

For example, control gates $465_{1,1}$ and $465_{1,2}$ are respectively control gates of select gates, such as source select gates $470_{2,1}$ and $470_{2,2}$; control gates $465_{2,1}$ and $465_{2,2}$ are respectively control gates of memory cells (e.g., non-volatile memory cells) $472_{2,1}$ and $472_{2,2}$; and control gates $465_{3,1}$ and $465_{3,2}$ are respectively control gates of select gates, such as drain select gates $474_{2,1}$ and $474_{2,2}$, as shown in FIGS. 4E and 5E. Control gates $465_{2,1}$ and $465_{2,2}$ may respectively form portions of access lines (e.g., word lines $480_1$ and $480_2$) as shown in FIG. 5E. For example, control gates $465_{2,1}$ and $465_{2,2}$ may be respectively coupled to word lines $480_1$ and $480_2$. Similarly, control gates $465_{1,1}$ and $465_{1,2}$ respectively form portions of source select lines and control gates $465_{3,1}$ and $465_{3,2}$ respectively form portions of drain select lines. For example, control gates $465_{1,1}$ and $465_{1,2}$ may be respectively coupled to the source select lines and control gates $465_{3,1}$ and $465_{3,2}$ may be respectively coupled to the drain select lines. Note that a memory cell 472 is located at each intersection of a word line 480 and charge trap 260; a source select gate 470 is located at each intersection of a source select line and charge trap 260; and drain select gate 474 located at each intersection of a drain select line and charge trap 260.

After forming control gates 465, a portion of the charge trap 260, a dielectric 208, and a portion of dielectric 204 may be optionally removed, e.g., as described above in conjunction with FIGS. 2D and 3D, exposing a portion of an upper surface of each of the pillar structures 435, portions of the semiconductor 220 adjacent to each of the pillars 235, the upper ends of semiconductor structures 455, portions of the sidewalls of semiconductor structures 455 adjacent their upper ends, and an upper surface of each of the control gates $465_{3,1}$ and $465_{3,2}$, as shown in FIG. 4E.

Source/drain regions 275 (e.g., drains) may then be formed (e.g. implanted) in the exposed semiconductors 220 and the exposed portions of the sidewalls of semiconductor structures 455 adjacent their upper ends, as shown in FIG. 4E, e.g., as described above in conjunction with FIG. 2D. Source/drain regions 277 (e.g., source lines) may be formed (e.g. implanted), e.g. substantially concurrently (e.g., concurrently) with source/drain regions 275 in the exposed portions of semiconductor 202, e.g., as described above in conjunction with FIG. 2D. Data lines (not shown), such as bit lines, may be electrically coupled to source/drain regions 275, and thus the drain select gates $474_{2,1}$ and $274_{2,2}$, by contacts, e.g., as described above in conjunction with FIG. 2D. Source/drain regions 277 are electrically coupled to source select gates $470_{2,1}$ and $470_{2,2}$ by semiconductor structures $455_2$.

The two semiconductor structures $455_2$ formed adjacent to (e.g. on) each of pillars $445_2$ respectively form channel regions of memory cells $472_{2,1}$ and $472_{2,2}$ and electrically couple memory cells $472_{2,1}$ and $472_{2,2}$ in series to form strings (e.g., NAND strings) of memory cells $472_{2,1}$ and $472_{2,2}$. In other words during operation of a string of memory cells $472_{2,1}$, a channel(s) can be formed in the respective semiconductor structure $455_2$, and during operation of a string of memory cells $472_{2,2}$, a channel(s) can be formed in the respective semiconductor structure $455_2$. One of the semiconductor structures $455_2$ electrically couples a string of memory cells $472_{2,1}$ in series to a source select gate $470_{2,1}$ at one end of that string and a drain select gate $474_{2,1}$ in series to the opposite end of that string, and the other semiconductor structure $455_2$ electrically couples a string of memory cells $472_{2,2}$ in series to a source select gate $470_{2,2}$ at one end of that string and a drain select gate $474_{2,2}$ in series to the opposite end of that string, as shown in FIG. 4E.

A source select gate $470_{2,1}$, a drain select gate $474_{2,1}$, and the string of memory cells $472_{2,1}$ electrically coupled thereto are formed adjacent to a first portion of the substantially vertical (e.g., vertical) sidewall each pillar $445_2$, and a source select gate $470_{2,2}$, a drain select gate $474_{2,2}$, and the string of memory cells $472_{2,2}$ electrically coupled thereto are formed adjacent to a second portion of the substantially vertical (e.g., vertical) sidewall the respective pillar $445_2$, as shown in FIGS. 4E and 5E. That is, there are two strings of memory cells with source and drain select gates coupled thereto adjacent to (e.g., on) each pillar $445_2$.

There are two strings of memory cells with source and drain select gates coupled thereto adjacent to (e.g., on) each pillar $445_1$. For example, the two semiconductor structures $455_1$ formed adjacent to (e.g., on) each of pillars $445_1$ respectively form channel regions of memory cells $472_{1,1}$ and $472_{1,2}$ (FIG. 5E) and electrically couple memory cells $472_{1,1}$ and $472_{1,2}$ in series to form strings (e.g., NAND strings) of memory cells $472_{1,1}$ and $472_{1,2}$. The ends of each of these strings are respectively coupled to a source select gate and a drain select gate by a respective one of the two semiconductor structures $455_1$. A string of memory cells $472_{1,1}$ (e.g., NAND string) coupled in series and the source and a drain select gates respectively coupled in series to the ends thereof are located adjacent to a first portion of the sidewall of a respective pillar $445_1$, and a string of memory cells $472_{1,2}$ (e.g., NAND string) coupled in series and the source and a drain select gates respectively coupled in series to the ends thereof are located adjacent to a second portion of the sidewall of the respective pillar $445_1$.

Each memory cell $472_{1,1}$ includes a portion of semiconductor structure $455_1$, as a channel region thereof, adjacent to (e.g., in direct contact with) an outer surface of a first portion (e.g., a corner) of the sidewall $443_1$ (FIG. 5D) of a respective pillar $445_1$, a portion of a charge trap 260 adjacent to the portion of semiconductor structure $455_1$, and a control gate $465_{2,1}$ adjacent to the portion of charge trap 260, as shown in FIG. 5E. Each memory cell $472_{1,2}$ includes a portion of an other semiconductor structure $455_1$, as a channel region thereof, adjacent to (e.g., in direct contact with) an outer surface of a second portion (e.g., an opposite corner) of the sidewall $443_1$ of the respective pillar $445_1$, an other portion of the charge trap 260 adjacent to the portion of the other semiconductor structure $455_1$, and a control gate $465_{2,2}$ adjacent to the other portion of the charge trap 260, as shown in FIG. 5E. For example, a memory cell $472_{1,1}$ and a memory cell $472_{1,2}$ may wrap around portions of sidewall $443_1$ of a pillar $445_1$.

Each memory cell $472_{2,1}$ includes a portion of semiconductor structure $455_2$, as a channel region thereof, adjacent to (e.g., in direct contact with) an outer surface of a first portion (e.g., a corner) of the sidewall $443_2$ (FIG. 5D) of a respective pillar $445_2$, a portion of a charge trap 260 adjacent to the semiconductor structure $455_2$, and a control gate $465_{2,1}$ adjacent to the portion of the charge trap 260, as shown in FIGS. 4E and 5E. Each memory cell $472_{2,2}$ includes a portion of an other semiconductor structure $455_2$, as a channel region thereof, adjacent to (e.g., in direct contact with) an outer surface of a second portion (e.g., an opposite corner) of the sidewall $443_2$ of the respective pillar $445_2$, an other portion of the charge trap 260 adjacent to the portion of the other semiconductor structure $455_2$, and a control gate $465_{2,2}$ adjacent to the other portion of the charge trap 260, as shown in FIGS. 4E and 5E. For example, a memory cell $472_{2,1}$ and a memory cell $472_{2,2}$ may wrap around portions of sidewall $443_2$ of a pillar $445_2$. Note that four memory cells, e.g., memory cells $472_{1,1}$, $472_{1,2}$, $472_{2,1}$, and $472_{2,1}$, respectively wrap around the four corners of a pillar structure 435, e.g., and as such, may be termed "quarter-wrap" memory cells.

Control gates $465_{2,1}$ and $465_{2,2}$, and thus the word lines $480_1$ and $480_2$, may be electrically isolated from each other, e.g., by a dielectric (not shown), e.g., bulk insulation, that may be formed between word lines $480_1$ and $480_2$. Adjacent word lines $480_2$ may be similarly isolated from each other.

For some embodiments, charge traps 260 may form contiguous structures that are wrapped completely around the peripheries of pillars $445_1$, including the two semiconductor structures $455_1$ adjacent thereto, and completely around the peripheries of pillars $445_2$, including the two semiconductor structures 455₂ adjacent thereto. A portion of a charge trap 260 may be interposed between the two semiconductor structures 455₂ on the sidewall 443₂, and a portion of a charge trap 260 may be interposed between the two semiconductor structures 455₁ on the sidewall 443₁. A dielectric, e.g., bulk insulation, may be formed in an opening 485, i.e., remaining portion of an opening 440 (FIG. 5C), located between portions of the charge traps 260 wrapped around the peripheries of pillars 445₁ and 445₂.

Portions 442₁ and 442₂ respectively of sidewalls 443₁ and 443₂ respectively of pillars 445₁ and 445₂ may face each other, as shown in FIG. 5E. Note that portions 442₁ and 442₂ are covered by portions of charge trap 260, but are devoid of conductor, such as portions of semiconductor structures 455.

Source select gates 470 and drain select gates 474 have substantially the same (e.g., the same) cross-sections as those shown for memory cells 472 in FIG. 5E. Each source select gate 470₂,₁ includes a portion of semiconductor structure 455₂, as a channel region thereof, adjacent to (e.g., in direct contact with) the outer surface of the first portion (e.g., the corner) of the sidewall of a respective pillar 445₂, a portion of a charge trap 260 adjacent to the portion of semiconductor structure 455₂, and a control gate 465₁,₁ adjacent to the portion of charge trap 260, as shown in FIG. 4E. Each source select gate 470₂,₂ includes a portion of the other semiconductor structure 455₂, as a channel region thereof, adjacent to (e.g., in direct contact with) the outer surface of the second portion (e.g., the opposite corner) of the sidewall of the respective pillar 445₂, an other portion of the charge trap 260 adjacent to the portion of the other semiconductor structure 455₂, and a control gate 465₁,₂ adjacent to the other portion of the charge trap 260, as shown in FIG. 4E. For example, a source select gate 470₂,₁ and a source select gate 470₂,₂ may wrap around portions of the sidewall of a pillar 445₂ in a manner similar to that shown in FIG. 5E for memory cells 472₂,₁ and 472₂,₂. Note that four source select gates respectively wrap around the four corners of a pillar structure 435, e.g., and as such, may be termed "quarter-wrap" source select gates.

Each drain select gate 474₂,₁ includes a portion of semiconductor structure 455₂, as a channel region thereof, adjacent to (e.g., in direct contact with) the outer surface of the first portion (e.g., the corner) of the sidewall of a respective pillar 445₂, a portion of a charge trap 260 adjacent to the portion of semiconductor structure 455₂, and a control gate 465₃,₁ adjacent to the portion of charge trap 260, as shown in FIG. 4E. Each drain select gate 474₂,₂ includes a portion of the other semiconductor structure 455₂, as a channel region thereof, adjacent to (e.g., in direct contact with) the outer surface of the second portion (e.g., the opposite corner) of the sidewall of the respective pillar 445₂, an other portion of the charge trap 260 adjacent to the portion of the other semiconductor structure 455₂, and a control gate 465₃,₂ adjacent to the other portion of the charge trap 260, as shown in FIG. 4E. For example, a drain select gate 474₂,₁ and a drain select gate 474₂,₂ may wrap around portions of the sidewall of a pillar 445₂ in a manner similar to that shown in FIG. 5E for memory cells 472₂,₁ and 472₂,₂. Note that four drain select gates respectively wrap around the four corners of a pillar structure 435, e.g., and as such may be termed quarter-wrap drain select gates. The source and drain select gates can be programmable and may be programmed or left unprogrammed.

Note that a word line 480₁ is commonly coupled to the memory cells 472₁,₁ and 472₂,₁ respectively on different pillars 445₁ and 445₂, and a word line 480₂ is commonly coupled to the memory cells 472₁,₂ and 472₂,₂ respectively on those different pillars 445₁ and 445₂, as shown in FIG. 5E.

Referring to FIG. 3D, the access-line (e.g., word-line) pitch $WL_{Pitch200}$ and the data-line (e.g., bit-line) pitch $BL_{Pitch200}$ are shown for memory array 200. The word-line pitch $WL_{Pitch200}$ may be expressed as $$WL_{Pitch200} = WS + 2(R+W) + CTF + Tsi \quad (1)$$

and the bit-line pitch $BL_{Pitch200}$ may be expressed as $$BL_{Pitch200} = W + 2Tsi + 2CTF + OD \quad (2)$$

where the distances WS, (R+W), CTF, W, and Tsi are shown in FIG. 3D.

The bit-line pitch may be the pitch of the memory cells commonly coupled to a word line, e.g., in the word-line direction, while the word-line pitch may be the pitch of the memory cells in the bit-line direction. Note that the thickness of a semiconductor structure 255 (e.g., the term Tsi) occurs twice in the pitch $BL_{Pitch200}$.

Referring to FIG. 5E, the access-line (e.g., word-line) pitch $WL_{Pitch400}$ and the data-line (e.g., bit-line) pitch $BL_{Pitch400}$ are shown for memory array 400. The word-line pitch $WL_{Pitch400}$ may be expressed as $$WL_{Pitch400} = WS + 2(R+W) + CTF + Tsi \quad (3)$$

and the bit-line pitch $BL_{Pitch400}$ may be expressed as $$BL_{Pitch400} = 0.5PS + 0.5W + (R+W) + Tsi + CTF \quad (4)$$

where the distances WS, (R+W), CTF, PS, W, and Tsi are shown in FIG. 5E. The distance PS may be substantially the same (e.g., the same as) WS. Note that the thickness of a semiconductor structure 455 (e.g., the term Tsi) occurs once in the pitch $BL_{Pitch400}$.

Figure 6:
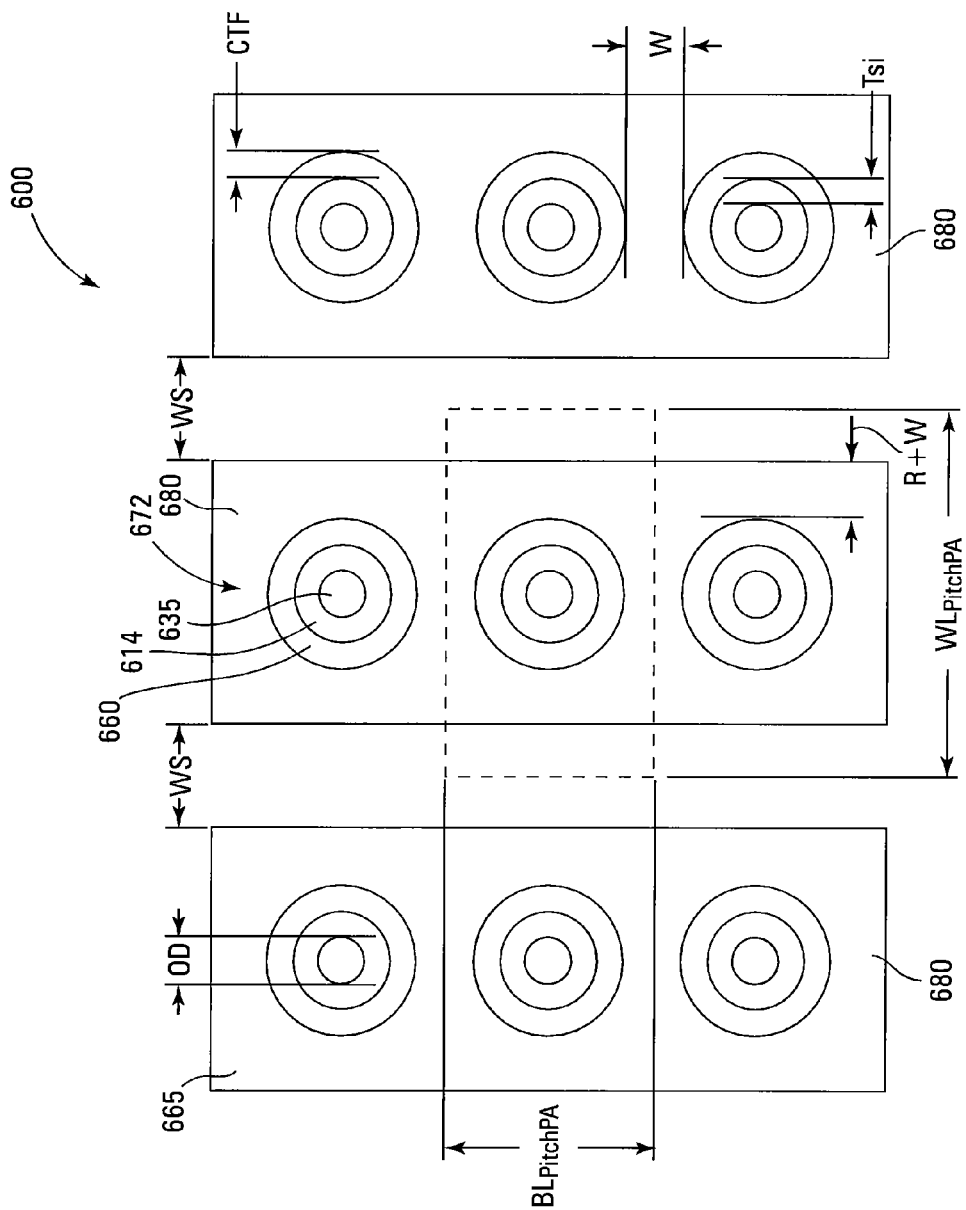
FIG. 6 is a cross-sectional view of a memory array, as viewed from the top, according to the prior art.

FIG. 6 is a cross-sectional view (cross-hatching omitted) of a memory array 600, as viewed from the top, according to the prior art. FIG. 6 is analogous to the views of FIGS. 3D and 5E. Memory array 600 includes a plurality of memory cells 672 that are coupled to access lines, e.g., word lines 680. Each memory cell 672 is completely wrapped around a sidewall (e.g., the perimeter) of a pillar 635 that may be formed from a dielectric. As such, a memory cell 672 may be termed a "full-wrap" memory cell, as compared with the "half-wrap" memory cells 272 of memory array 200 in FIG. 3D and the "quarter-wrap" memory cells 472 of memory array 400 in FIG. 5E. A string of series coupled memory cells 672 is formed adjacent to each pillar 635, i.e., one string per pillar 635.

Each memory cell 672 includes a semiconductor 614 formed adjacent to and completely wrapped around a respective pillar 635. A charge trap 660 is formed adjacent to and is completely wrapped around a respective semiconductor 614. A control gate 665 that forms a portion of a respective word line 680 is formed adjacent to and is completely wrapped around a respective charge trap 660.

The access-line (e.g., word-line) pitch $WL_{PitchPA}$ and the data-line (e.g., bit-line) pitch $BL_{PitchPA}$ are shown for memory array 600 in FIG. 6. The word-line pitch $WL_{PitchPA}$ may be expressed as $$WL_{PitchPA} = WS + 2(R+W) + 2CTF + 2Tsi + OD \quad (5)$$

and the bit-line pitch $BL_{PitchPA}$ may be expressed as $$BL_{PitchPA} = W + 2CTF + Tsi + OD \quad (6)$$

where the distances WS, (R+W), CTF, OD, W, and Tsi are shown in FIG. 6. For typical values of CTF=20 nm, Tsi=10 nm, OD=30 nm, WS=30 nm, R=10 nm, and W=10 nm, $WL_{PitchPA}$=160 nm and $BL_{PitchPA}$=100 nm.

The word-line pitches $WL_{Pitch200}$ and $WL_{Pitch400}$ respectively given by equations (1) and (3) for memory arrays 200 and 400 are the same. Subtracting either of equations (1) and (3) from equation (5) gives the difference between the word-line pitch $WL_{PitchPA}$ of the "full-wrap" memory cells of the prior art and the word-line pitches $WL_{Pitch200}$ and $WL_{Pitch400}$ respectively for the "half-wrap" and "quarter-wrap" cells to be $$\Delta WL_{Pitch}=CTF+Tsi+OD \quad (7)$$

which is clearly greater than zero.

For typical values of CTF=20 nm, Tsi=10 nm, and OD=30 nm, $\Delta WL_{Pitch}$=60 nm. That is, the word-line pitch for the "half-" and "quarter-wrap" memory cells is expected to be about 38 percent less than the word line pitch for the "full-wrap" memory cells of the prior art, based on the typical values.

Subtracting equation (2) from equation (6) shows that that the bit-line pitch $BL_{PitchPA}$ of the "full-wrap" memory cells of the prior art and the bit-line pitch $BL_{Pitch200}$ for the "half-wrap" cells are the same. Subtracting equation (4) from equation (6) gives the difference between the bit-line pitch $BL_{PitchPA}$ of the "full-wrap" memory cells of the prior art and the bit-line pitch $BL_{Pitch400}$ for the "quarter-wrap" cells of memory array 400 to be $$\Delta BL_{Pitch(PA-400)}=CTF+Tsi+OD-0.5PS-R-0.5W \quad (8)$$

In spite of the negative terms, equation (8) still typically gives a number greater than zero. For example, for typical values of CTF=20 nm, Tsi=10 nm, OD=30 nm, PS=30 nm, R=10 nm, and W=10 nm, $\Delta BL_{Pitch(PA-400)}$=30 nm. That is, the bit-line pitch for the "quarter-wrap" memory cells is expected to be about 30 percent less than the bit-line pitch for the "full-wrap" memory cells of the prior art, based on the typical values. Note that since the bit-line pitch of the "full-wrap" memory cells of the prior art and the bit-line pitch for the "half-wrap" cells are the same, the bit-line pitch for the "quarter-wrap" memory cells is expected to be about 30 percent less than the bit-line pitch for the "half-wrap" memory cells. For embodiments involving dielectric pillars, this is due, at least in part, to the fact that adjacent quarter-wrap" memory cells in the word line direction and commonly coupled to a single word line 480 are located adjacent to pillars $445_1$ and $445_2$ (FIG. 5E) that are formed from a single dielectric pillar structure 435 (FIG. 5B) formed in a single opening, whereas adjacent half-wrap" memory cells in the word line direction and commonly coupled to a single word line 280 are located adjacent to separate pillars 235 (FIG. 3D) that are formed from separate dielectrics formed in separate openings.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An electronic system, comprising:
   first and second substantially vertical semiconductor structures;
   a first string of series-coupled first memory cells, each first memory cell comprising a first charge storage structure adjacent to the first semiconductor structure and a first control gate adjacent to the first charge storage structure; and
   a second string of series-coupled second memory cells, each second memory cell comprising a second charge storage structure adjacent to the second semiconductor structure and a second control gate adjacent to the second charge storage structure;
   wherein no control gates are interposed between the semiconductor structures.

2. The electronic system of claim 1, further comprising a memory device that comprises the first string of series-coupled first memory cells and the second string of series-coupled second memory cells.

3. The electronic system of claim 2, further comprising a controller coupled to the memory device.

4. The electronic system of claim 1, wherein the first charge storage structure is separated from the second charge storage structure.

5. The electronic system of claim 4, wherein the first charge storage structure wraps completely around the first semiconductor structure and the second charge storage structure wraps completely around the second semiconductor structure.

6. The electronic system of claim 1, wherein the first and second semiconductor structures respectively comprise first and second semiconductor pillars.

7. The electronic system of claim 1, wherein the first semiconductor structure forms a channel region for the first string of series-coupled first memory cells and the second semiconductor structure forms a channel region for the second string of series-coupled second memory cells.

8. The electronic system of claim 1, further comprising a dielectric between the first and the second charge storage structures.

9. The electronic system of claim 1, wherein the first and second semiconductor structures are connected together.

10. An electronic system, comprising:
    first and second substantially vertical semiconductor structures;
    a plurality of first memory cells coupled in series by the first semiconductor structure, each first memory cell comprising a first portion of a charge storage structure adjacent to the first semiconductor structure and a first control gate adjacent to the first portion of the charge storage structure; and
    a plurality of second memory cells coupled in series by the second semiconductor structure, each second memory cell comprising a second portion of the charge storage structure adjacent to the second semiconductor structure and a second control gate adjacent to the second portion of the charge storage structure;
    wherein each first control gate is electrically isolated from each second control gate.

11. The electronic system of claim 10, further comprising a memory device that comprises the plurality of first memory cells and the plurality of second memory cells.

12. The electronic system of claim 11, further comprising a controller coupled to the memory device.

13. The electronic system of claim 10, wherein the first and second semiconductor structures are adjacent to a dielectric.

14. The electronic system of claim 13, wherein the charge trap is wrapped completely around the dielectric and the first and second semiconductor structures.

15. The electronic system of claim 10, wherein the charge storage structure wraps around a portion of the first semiconductor structure and a portion of the second semiconductor structure.

16. The electronic system of claim 10, wherein a third portion of the charge trap is between the control gates of successively adjacent first memory cells and between the control gates of successively adjacent second memory cells.

17. The electronic system of claim 10, wherein each of the control gates is electrically isolated from a successive control gate in its string by a dielectric.

18. The electronic system of claim 17, wherein a third portion of the charge trap is over at least a portion of each dielectric.

19. An electronic system, comprising:
- a controller;
- a memory device coupled to the controller, and comprising:
    - first and second substantially vertical semiconductor pillars;
        - a first string of series-coupled first memory cells, each first memory cell comprising a first charge storage structure that wraps completely around the first semiconductor pillar and a first control gate adjacent to the first charge storage structure; and
        - a second string of series-coupled second memory cells, each second memory cell comprising a second charge storage structure that Wraps completely around the second semiconductor pillar and a second control gate adjacent to the second charge storage structure;
        - wherein no control gates are interposed between the first and second semiconductor pillars.

20. The electronic system of claim 19, wherein the memory device further comprises a dielectric between the first and the second charge storage structures.

21. The electronic system of claim 19, wherein the semiconductor pillars are connected together at their bottoms.

* * * * *